(12) United States Patent
Suzuki et al.

(10) Patent No.: US 11,885,017 B2
(45) Date of Patent: Jan. 30, 2024

(54) VAPORIZER AND METHOD FOR MANUFACTURE THEREOF

(71) Applicant: WELCON INC., Niigata (JP)

(72) Inventors: Yutaka Suzuki, Niigata (JP); Takashi Saito, Niigata (JP)

(73) Assignee: WELCON INC.

( * ) Notice: Subject to any disclaimer, the term of this patent is extended or adjusted under 35 U.S.C. 154(b) by 103 days.

(21) Appl. No.: 17/602,801

(22) PCT Filed: Apr. 17, 2019

(86) PCT No.: PCT/JP2019/016527
§ 371 (c)(1),
(2) Date: Oct. 11, 2021

(87) PCT Pub. No.: WO2020/213104
PCT Pub. Date: Oct. 22, 2020

(65) Prior Publication Data
US 2022/0154333 A1 May 19, 2022

(51) Int. Cl.
*C23C 16/44* (2006.01)
*C23C 16/455* (2006.01)
(Continued)

(52) U.S. Cl.
CPC ......... *C23C 16/455* (2013.01); *C23C 16/06* (2013.01); *C23C 16/4481* (2013.01); *C23C 16/4486* (2013.01); *C23C 16/52* (2013.01)

(58) Field of Classification Search
CPC ... C23C 16/455; C23C 16/06; C23C 16/4481; C23C 16/4486; C23C 16/52;
(Continued)

(56) References Cited

U.S. PATENT DOCUMENTS 4,031,862 A * 6/1977 Smith ................ F28F 21/006
122/DIG. 13
4,050,511 A * 9/1977 McDonald ............ F28D 7/0041
165/162

(Continued)

FOREIGN PATENT DOCUMENTS

CN 101285178 A 10/2008
CN 206486294 U 9/2017
(Continued)

OTHER PUBLICATIONS

Machine translation, JP 03-252062 (Year: 1991).*
(Continued)

*Primary Examiner* — Rudy Zervigon
(74) *Attorney, Agent, or Firm* — Harness, Dickey & Pierce, P.L.C.

(57) ABSTRACT

A vaporizer is provided that is capable of heating source material mist under precise temperature management and thereby able to acquire a gas source material which can be adjusted to a prescribed temperature and which has a very low level of variation in temperature and that produces almost no precipitate. The vaporizer heats and vaporizes a source material mist to obtain a gas source material for film forming. The vaporizer comprises a main part formed from a metal material and having therein first flows path through which the source material mist flows and second flow paths through which a heating medium for heating the source material mist flows, the equivalent area circle diameter of the cross-section of the first flow paths is 5 mm or less while the equivalent area circle diameter of the cross-section of the second flow paths is 2 mm or less, and there are no gaps aside from the second flow paths between one of the first flow paths and another of the first flow paths adjacent thereto in the inside of the main part.

7 Claims, 30 Drawing Sheets

(51) Int. Cl.
*C23C 16/06* (2006.01)
*C23C 16/448* (2006.01)
*C23C 16/52* (2006.01)

(58) Field of Classification Search
CPC ............ C23C 16/45561; C23C 16/303; C23C 16/4482; C23C 16/4408; C23C 16/45525; C23C 16/4583; C23C 16/448; C23C 16/45544; B01B 1/005; H01J 37/3244; B01D 1/02; B01D 1/04; B01D 1/06; F28F 1/00; F28F 3/08; F28F 9/013; F28F 9/0131; F28D 1/04; F28D 3/02; F28D 7/0025; F28D 7/0041; F28D 7/005; F28D 15/02; C30B 25/08; C30B 29/403; C30B 25/14; C30B 25/165; G01F 23/0007; G01F 23/04; B01J 4/008; B67D 7/3263; B67D 7/0238
USPC ......... 118/726, 715, 50; 156/345.29, 345.33, 156/345.34, 345.35
See application file for complete search history.

(56) References Cited

U.S. PATENT DOCUMENTS

| | | | | |
|---|---|---|---|---|
| 4,265,301 | A * | 5/1981 | Anderson | F28F 9/013 248/68.1 |
| 5,676,911 | A * | 10/1997 | Baumert | B01J 8/0278 422/198 |
| 6,019,070 | A * | 2/2000 | Duffy | F22B 37/50 122/209.1 |
| 6,617,067 | B1 * | 9/2003 | Tachihara | H01M 8/0631 261/157 |
| 10,147,597 | B1 | 12/2018 | Lee et al. | |
| 2002/0124961 | A1 | 9/2002 | Porter et al. | |
| 2003/0116091 | A1 | 6/2003 | Grant et al. | |
| 2004/0007349 | A1 * | 1/2004 | Youn | F28D 5/02 165/115 |
| 2006/0070575 | A1 | 4/2006 | Yamoto et al. | |
| 2006/0248800 | A1 * | 11/2006 | Miglin | B01J 8/0278 48/198.3 |
| 2008/0245306 | A1 | 10/2008 | Nakao et al. | |
| 2009/0065066 | A1 | 3/2009 | Ono | |
| 2010/0186673 | A1 * | 7/2010 | Tanaka | C23C 16/4486 257/E21.482 |
| 2012/0018133 | A1 * | 1/2012 | Postma | F28D 3/02 165/104.21 |
| 2013/0206374 | A1 * | 8/2013 | Roisin | F28D 7/0041 165/165 |
| 2013/0283827 | A1 * | 10/2013 | Wang | F28D 1/0341 62/61 |
| 2017/0165620 | A1 | 6/2017 | Ito et al. | |
| 2017/0307301 | A1 * | 10/2017 | Sørensen | F28F 27/02 |
| 2018/0224173 | A1 * | 8/2018 | DelVentura | F28F 9/013 |
| 2022/0026157 | A1 * | 1/2022 | Nakayama | F28D 7/087 |

FOREIGN PATENT DOCUMENTS

| | | | |
|---|---|---|---|
| CN | 107308666 A | 11/2017 | |
| EP | 828012 A1 * | 3/1998 | ............... B01D 1/16 |
| JP | 03252062 A * | 11/1991 | |
| JP | H03-252062 A | 11/1991 | |
| JP | H09181061 A | 7/1997 | |
| JP | H10-135197 A | 5/1998 | |
| JP | 2005-506681 A | 3/2005 | |
| JP | 2005-511894 A | 4/2005 | |
| JP | 3896594 B2 | 3/2007 | |
| JP | 2007-100207 A | 4/2007 | |
| JP | 2009-054655 A | 3/2009 | |
| JP | 2013-023700 A | 2/2013 | |
| KR | 2013-0031441 A | 3/2013 | |
| KR | 101339600 B1 | 1/2014 | |

OTHER PUBLICATIONS

Extended European Search Report issued for the corresponding European Patent Application No. EP19924887.3; dated Apr. 4, 2022 (total 6 pages).

International Search Report (English and Japanese) of the International Searching Authority issued in PCT/JP2019/016527, dated Jul. 10, 2019; ISA/JP (5 pages).

\* cited by examiner

VAPORIZER AND METHOD FOR MANUFACTURE THEREOF

CROSS REFERENCE TO RELATED APPLICATIONS

This application is a U.S. National Phase Application under 35 U.S.C. 371 of International Application No. PCT/JP2019/016527, filed on Apr. 17, 2019. The entire disclosure of the above application is expressly incorporated by reference herein.

BACKGROUND

Technical Field

The present invention relates to a vaporizer and a manufacturing method thereof.

Related Art

An exemplary method of forming a film on a surface of an object using a gaseous material includes a CVD (Chemical vapor deposition) method. For instance, in a manufacturing process of a semiconductor device, in general, several thin films are formed on a wafer by the CVD method. There is also a case where an etching gas is blown onto thin films formed on a wafer by the CVD method to remove a part of the thin films, thereby performing patterning.

Several techniques for obtaining a gaseous material for use as a thin film material or an etching material in the CVD method or the like have heretofore been proposed.

For instance, JP 9-181061 A describes a liquid material-vaporizing method which involves vaporizing a liquid material stored in a liquid tank with a bubbling system, the method including: a step of vaporizing the liquid material in the liquid tank under bubbling using a carrier gas at a predetermined flow rate to generate a high-concentration material gas; a step of mixing the high-concentration material gas with a dilution gas to dilute the high-concentration material gas into a material gas having a predetermined concentration; and a step of performing flow rate control so that the material gas having the predetermined concentration has a predetermined flow rate and introducing the material gas having the predetermined concentration under the flow rate control into a treatment chamber where a member to be treated is subjected to a predetermined treatment. Then, it is described that the method as described above is capable of consistently supplying a material gas having a predetermined concentration under highly precise control even at a low flow rate, and performing consistent low-concentration doping by using in a CVD apparatus and the like in a planarization process, thereby improving reliability of insulating films.

For instance, JP 3896594 B describes a vaporizer for CVD including: an orifice tube which has one gas path and where two or more raw-material solutions are dispersed in a carrier gas in a fine particulate or misty form; a plurality of paths for the two or more raw-material solutions which communicate with the gas path of the orifice tube and from which the two or more raw-material solutions are supplied separately from one another; a path for the carrier gas from which the carrier gas is supplied to the orifice tube separately from the two or more raw-material solutions; and a vaporizing tube which vaporizes the two or more raw-material solutions dispersed in the orifice tube. An ejecting portion ejecting gas in the orifice tube is inserted into the vaporizing tube, and the ejecting portion is formed into such a tapered shape that the outer diameter of the ejecting portion is reduced toward its tip side. Then, it is described that it is possible to provide a vaporizer for CVD with which many kinds of raw-material solutions can be dispersed in a carrier gas in a fine particulate or misty form, which is less likely to cause clogging, and which can precisely control the flow rates of the raw-material solutions for CVD over a long period of time.

For instance, JP 2007-1002007 A describes a vaporizer including: a vaporizing chamber heated by heaters; a primary filter positioned in a bottom end portion of the vaporizing chamber and heated by any of the heaters; a liquid material supply portion for dripping a flow rate-controlled liquid material from an upper portion of the vaporizing chamber toward the primary filter; a carrier gas guiding passage for guiding a carrier gas into an underside of the primary filter; and a material delivering passage for discharging a mixed gas including the carrier gas and a vaporized liquid material from above the vaporizing chamber. Then, it is described that such a vaporizer is capable of vaporizing a liquid material and forming mist at the primary filter, and further vaporizing the mist in the vaporizing chamber, so that a high vaporization efficiency can be exhibited as compared to conventional vaporizers which involves simply adding heat, and owing to the high vaporization efficiency, it is possible to vaporize the liquid material even at low temperatures, to prevent accumulation of thermally decomposed products and polymers in the interior of the vaporizer and clogging of the flow passages even when the liquid material has high thermal decomposition performance, and to vaporize a large amount of the liquid material.

For instance, JP 2013-23700 A describes a vaporizer including: an outer block in which heaters for heating a liquid material or a gas mixture of the liquid material and a carrier gas are embedded and which has a circular hole for forming a vaporizing chamber; and a cylindrical inner block in which a heater for heating the liquid material or the gas mixture of the liquid material and the carrier gas is embedded and which has a slightly smaller diameter than the hole for forming the vaporizing chamber, an introduction hole introducing the liquid material or the gas mixture of the liquid material and the carrier gas into a vaporization flow path formed between the hole for forming the vaporizing chamber and the inner block, and a discharge hole discharging a vaporized liquid material gas or a gas mixture of the vaporized liquid material gas and the carrier gas from the vaporization flow path being formed in the outer block. Then, it is described that the vaporizer as described above is capable of efficiently feeding heat from the wall of the vaporizer to the gas mixture by the thermal boundary layer effect obtained by the slit-like vaporization flow path having a small width and formed between the hole for forming the vaporizing chamber and the inner block, and the centrifugal force effect obtained by an arc, and further capable of achieving complete vaporization of the liquid material by the synergistic effect of adiabatic expansion and rapid heat feeding from the heaters to adiabatically expanded areas.

However, in the conventional methods illustrated in JP 9-181061 A, JP 3896594 B, JP 2007-1002007 A, and JP 2013-23700 A, it was difficult to obtain a gaseous material adjusted to have a desired temperature because of difficulty in strict temperature control, and the gaseous material obtained tended to have a different temperature from the desired temperature. The gaseous material also widely varied in temperature. Further, there was also a case where deposits such as solid materials were formed in the vaporizers.

An object of the present invention is to solve the problems as described above.

Specifically, an object is to provide a vaporizer which is capable of obtaining a gaseous material adjusted to have a desired temperature and having very small variations in temperature, and further with which deposits are scarcely formed, or are less likely to be accumulated even if the deposits are formed. It is assumed that a vaporizer can be downsized in a case where a gaseous material adjusted to have a desired temperature and having very small variations in temperature can be obtained. Another object is to provide a manufacturing method of the vaporizer as described above.

SUMMARY

The inventors of the present invention have made an intensive study to solve the problems described above and completed the present invention.

The present invention provides the following (1) to (7).

(1) A vaporizer for obtaining a gaseous material for film formation by vaporizing a mist of material through heating,
the vaporizer including inside a main part made of a metallic material: first flow paths through which the mist of material flows and second flow paths through which a heat medium for heating the mist of material flows;
the first flow paths having a cross-sectional diameter in terms of equal area circle equivalent diameter of 5 mm or less, and the second flow paths having a cross-sectional diameter in terms of equal area circle equivalent diameter of 2 mm or less; and
voids other than the second flow paths do not exist inside the main part between one first flow path and other first flow paths present next thereto.

(2) The vaporizer for obtaining a gaseous material for film formation according to (1) above,
wherein, in a cross-section of the main part in a vertical direction with respect to a direction in which the mist of material flows,
when a direction in which the heat medium flows in a serpentine manner is taken as a horizontal direction, holes of the first flow paths are arranged in line in the horizontal direction, and hole rows are arranged to form layers in a vertical direction,
the second flow paths are present between vertically adjacent hole row layers, respectively, the second flow paths are not connected to the first flow paths, and the second flow paths vertically meander so as to avoid the holes of the first flow paths in the hole row layers between which the second flow paths are sandwiched in the vertical direction, respectively.

(3) The vaporizer for obtaining a gaseous material for film formation according to (1) or (2) above, wherein the vaporizer is configured so that, when each of the first flow paths is separated into a plurality of sections in its longitudinal direction, a temperature of the mist of material present inside each of the first flow paths is adjustable for each of the sections.

(4) The vaporizer for obtaining a gaseous material for film formation according to any one of (1) to (3) above, wherein, in a case where a surface in the main part at which holes for flowing the mist of material thereinto are formed is referred to as an inlet side surface, and a surface in the main part at which holes for discharging the gaseous material are formed is referred to as an outlet side surface, the equal area circle equivalent diameter of the first flow paths present in its interior gradually varies from the inlet side surface toward the outlet side surface.

(5) The vaporizer for obtaining a gaseous material for film formation according to any one of (1) to (4) above, wherein, in a case where the first flow paths are arranged to be in a vertical direction, the second flow paths are formed in a horizontal direction, and they are orthogonal to each other.

(6) The vaporizer for obtaining a gaseous material for film formation according to any one of (1) to (5) above, wherein the vaporizer is configured to include voids between outer surfaces of the main part and at least a part of the first flow paths and the second flow paths, whereby internal heat is less likely to be released outside.

(7) A vaporizer-manufacturing method for obtaining the vaporizer according to any one of (1) to (6) above, the vaporizer-manufacturing method including:
a step which includes preparing a plurality of metallic plates, forming grooves becoming part of the second flow paths at one main surface of each of the plurality of metallic plates, and further forming through-holes becoming part of the first flow paths and extending from the main surface to an opposite main surface; and
a step which includes bringing main surfaces of the metallic plates into close contact with each other and joining the metallic plates together by diffusion bonding.

Effect of the Invention

Because it is possible to heat a mist of material under strict temperature control, the present invention can provide a vaporizer which is capable of obtaining a gaseous material adjusted to have a desired temperature and having very small variations in temperature, and further with which deposits are scarcely formed. The present invention can also provide a manufacturing method of the vaporizer as described above.

DETAILED DESCRIPTION

Figure 1:
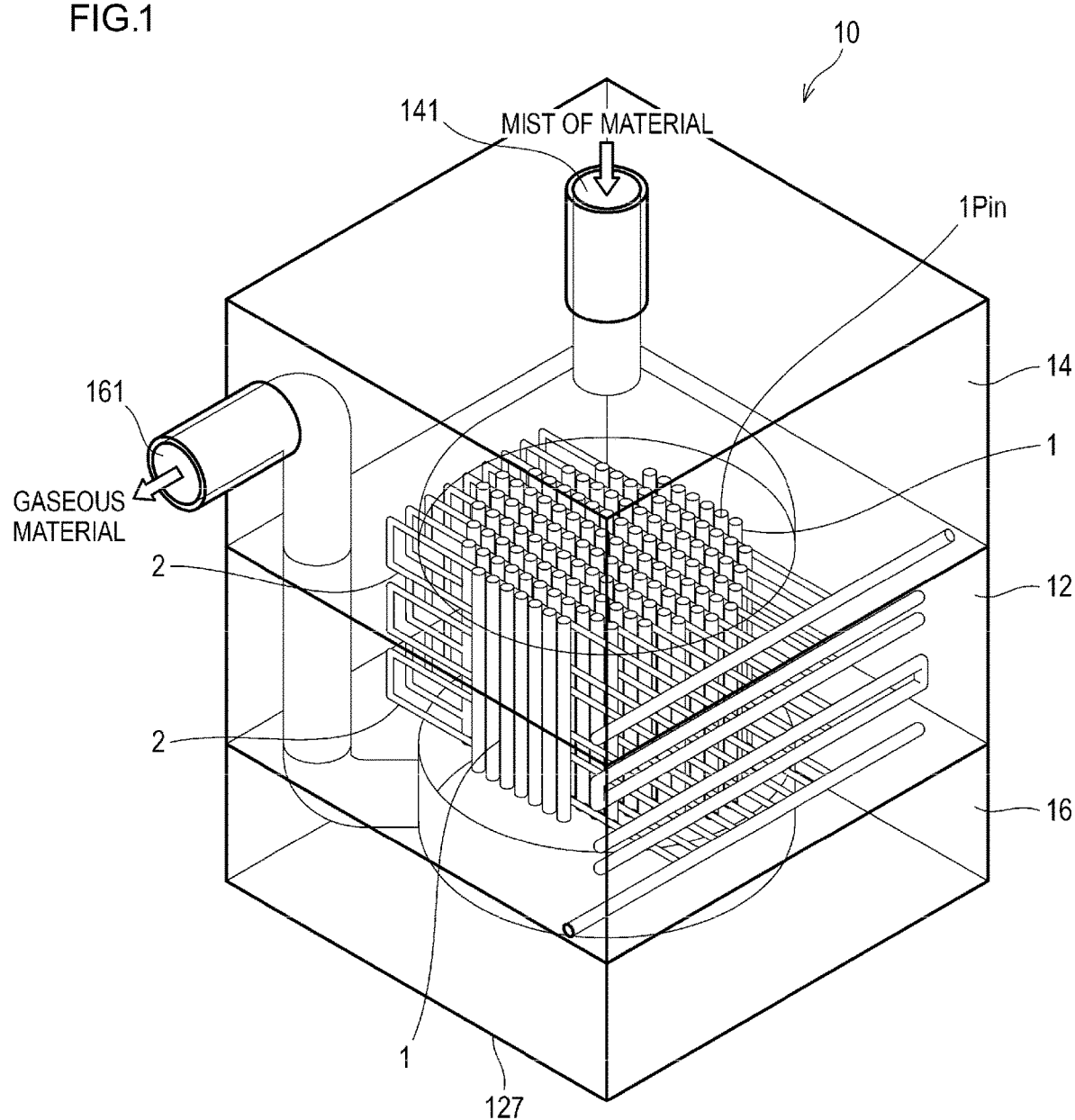
FIG. 1 is a schematic perspective view showing an embodiment of a vaporizer of the invention.

The present invention is now described.

The present invention provides a vaporizer for obtaining a gaseous material for film formation by vaporizing a mist of material through heating, the vaporizer including inside a main part made of a metallic material: first flow paths through which the mist of material flows and second flow paths through which a heat medium for heating the mist of material flows; the first flow paths having a cross-sectional diameter in terms of equal area circle equivalent diameter of 5 mm or less, and the second flow paths having a cross-sectional diameter in terms of equal area circle equivalent diameter of 2 mm or less; and voids other than the second flow paths do not exist inside the main part between one first flow path and other first flow paths present next thereto.

The vaporizer as described above is hereinafter referred to also as "vaporizer of the invention."

The present invention also provides a vaporizer-manufacturing method for obtaining the vaporizer of the invention, the vaporizer-manufacturing method including: a step which includes preparing a plurality of metallic plates, forming grooves becoming part of the second flow paths at one main surface of each of the plates, and further forming through-holes becoming part of the first flow paths and extending from the main surface to an opposite main surface; and a step which includes bringing main surfaces of the metallic plates into close contact with each other and joining the metallic plates together by diffusion bonding.

The vaporizer-manufacturing method as described above is hereinafter referred to also as "manufacturing method of the invention."

Vaporizer of the Invention

The vaporizer of the invention is now described.

The vaporizer of the invention is a vaporizer for obtaining a gaseous material for film formation by vaporizing a mist of material through heating.

The mist of material to be heated by the vaporizer of the invention contains a mist of liquid material and is preferably a mixture of the mist of liquid material and a carrier gas.

The carrier gas and the liquid material are not particularly limited in type, and may be, for example, a carrier gas and a liquid material conventionally used during formation of a thin film by a CVD method and etching of a part of the thin film as a part of a semiconductor device-manufacturing process.

Examples of the carrier gas include inert gases such as nitrogen and argon, and hydrogen.

Examples of the liquid material include solutions containing cyanogen, a fluoride, indium, gallium, aluminum, tantalum, and the like. Solutions of indium, gallium, aluminum, tantalum, and the like can be used for film formation.

On the other hand, solutions of cyanogen, a fluoride, and the like can be used for patterning which includes removing a part of a thin film formed.

When an etching gas such as cyanogen or a fluoride is used as the liquid material, a main part to be described later is preferably made of a metallic material (titanium, stainless steel, or the like) having excellent corrosion resistance.

The mist of material includes a mist of the liquid material as described above.

The method of obtaining a mist of liquid material is not particularly limited but may be, for example, a conventionally known method. A specific example includes a method which includes introducing a carrier gas and a liquid material into an atomizer to obtain a mist containing the liquid material in the form of mist dispersed in the carrier gas.

The mist of material may contain other materials than the carrier gas and the mist of liquid material. For instance, the mist of material may contain a liquid material which is not in the form of mist due to insufficient mist formation.

The vaporizer of the invention includes, for instance, a configuration shown in FIG. 1.

FIG. 1 is a schematic perspective view showing a preferred embodiment of the vaporizer of the invention.

In FIG. 1, a vaporizer 10 of the invention includes a main part 12 which has in its interior first flow paths 1 through which a mist of material flows, and second flow paths 2 through which a heat medium for heating the mist of material flows. The vaporizer further includes a supply part 14 for supplying the mist of material to the main part 12, and a discharge part 16 for collecting a gaseous material discharged from the main part 12 and discharging the collected gaseous material outside a system.

Supply Part

Figure 2:
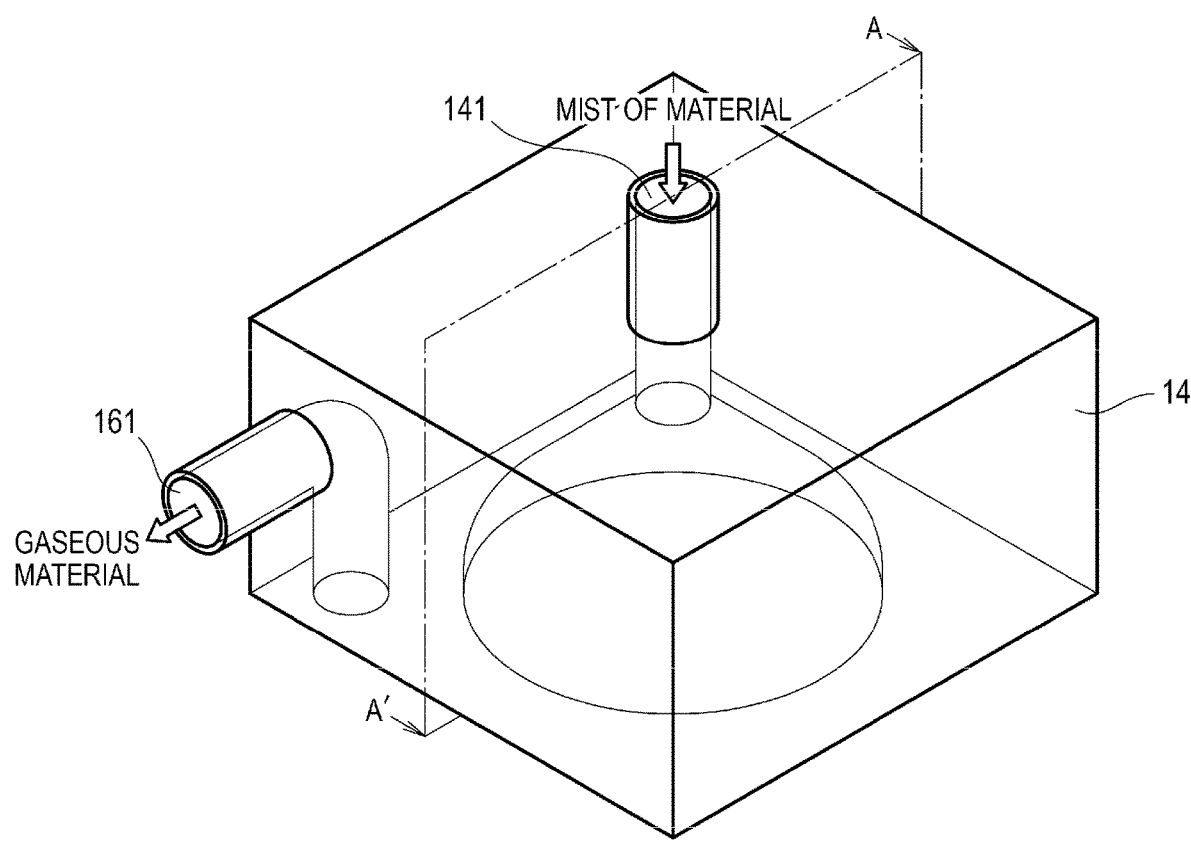
FIG. 2 is a schematic perspective view showing an embodiment of a supply part that the vaporizer of the invention may have.
Figure 3:
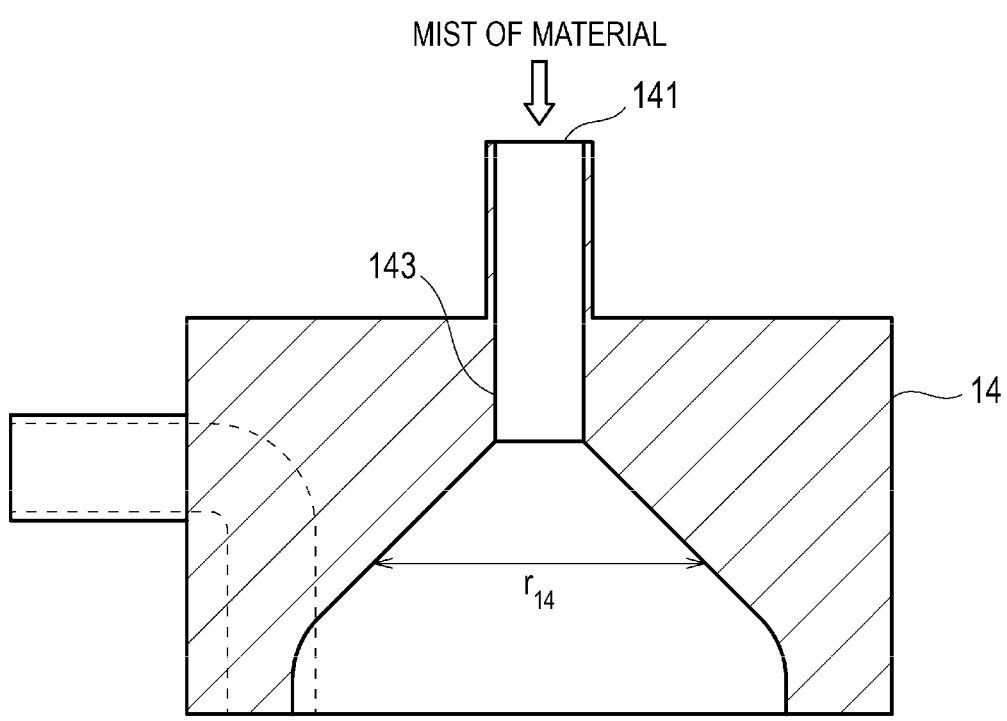
FIG. 3 is a cross-sectional view taken along line A-A' in the embodiment shown in FIG. 2.

FIG. 2 is a schematic perspective view of the supply part 14 shown in FIG. 1. FIG. 3 is a cross-sectional view taken along line A-A' in FIG. 2.

As shown in FIG. 2 and FIG. 3, the supply part 14 has an introduction hole 141 from which the mist of material is introduced. Then, the mist of material introduced from the introduction hole 141 into the interior of the supply part 14 is discharged from the supply part 14 and then supplied to the main part 12.

The supply part 14 shown in FIG. 2 and FIG. 3 is configured to supply the mist of material introduced from the introduction hole 141 to inlets 1Pin of the plurality of first flow paths 1 formed at a surface of the main part 12 as uniformly as possible. Specifically, as shown in FIG. 3, a flow path 143 of the mist of material is configured so that its cross-sectional diameter ($r_{14}$) is gradually increased inside the supply part 14.

The supply part 14 is preferably made of a metallic material as in the main part 12.

The vaporizer of the invention preferably has the supply part.

Main Part

Figure 4:
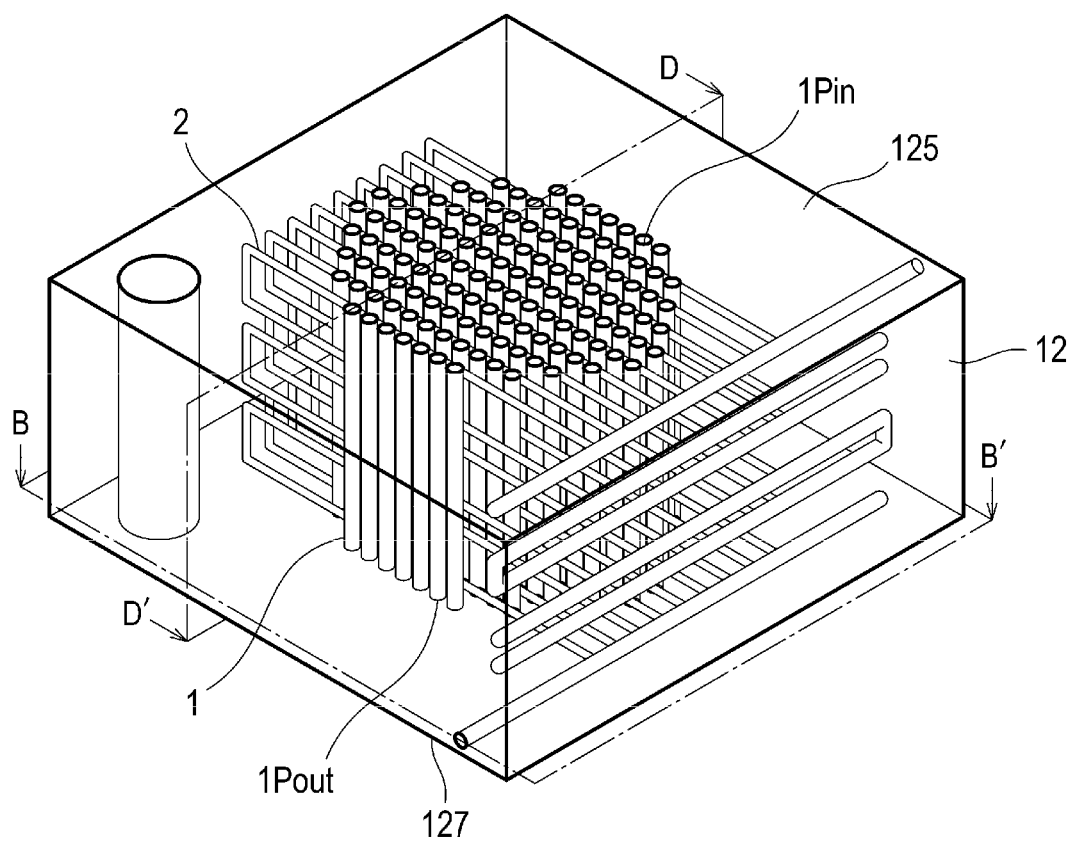
FIG. 4 is a schematic perspective view showing an embodiment of a main part that the vaporizer of the invention may have.
Figure 5:
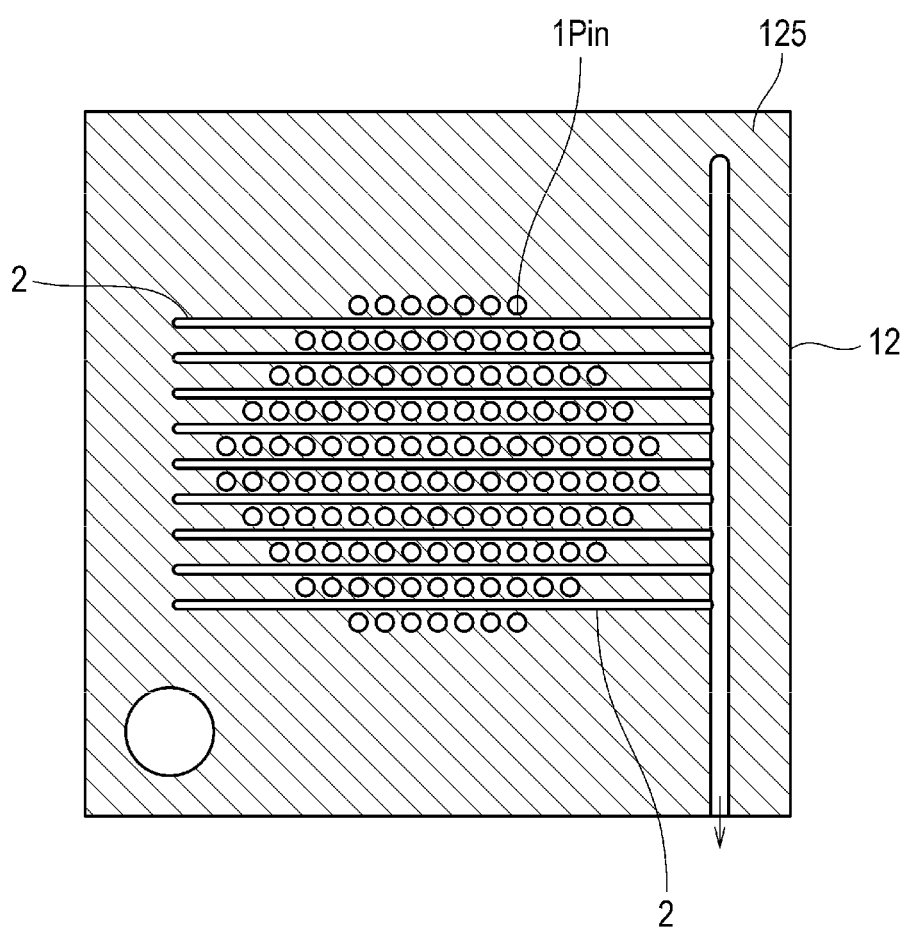
FIG. 5 is a cross-sectional view taken along line B-B' in the embodiment shown in FIG. 4.

FIG. 4 is a schematic perspective view of the main part 12 shown in FIG. 1. FIG. 5 is a cross-sectional view taken along line B-B' in FIG. 4.

As shown in FIG. 4 and FIG. 5, the main part 12 has in its interior the first flow paths 1 through which the mist of material flows, and the second flow paths 2 through which the heat medium for heating the mist of material flows.

In the embodiment shown in FIG. 4 and FIG. 5, in a case where the first flow paths 1 are arranged to be in a vertical direction, the second flow paths 2 are formed in a horizontal direction, and they are orthogonal to each other. Such an embodiment is preferred as the main part of the vaporizer of the invention.

The main part may be configured to be separable into some sections, and for instance, a spacer may be interposed between one main part and another main part.

Figure 6:
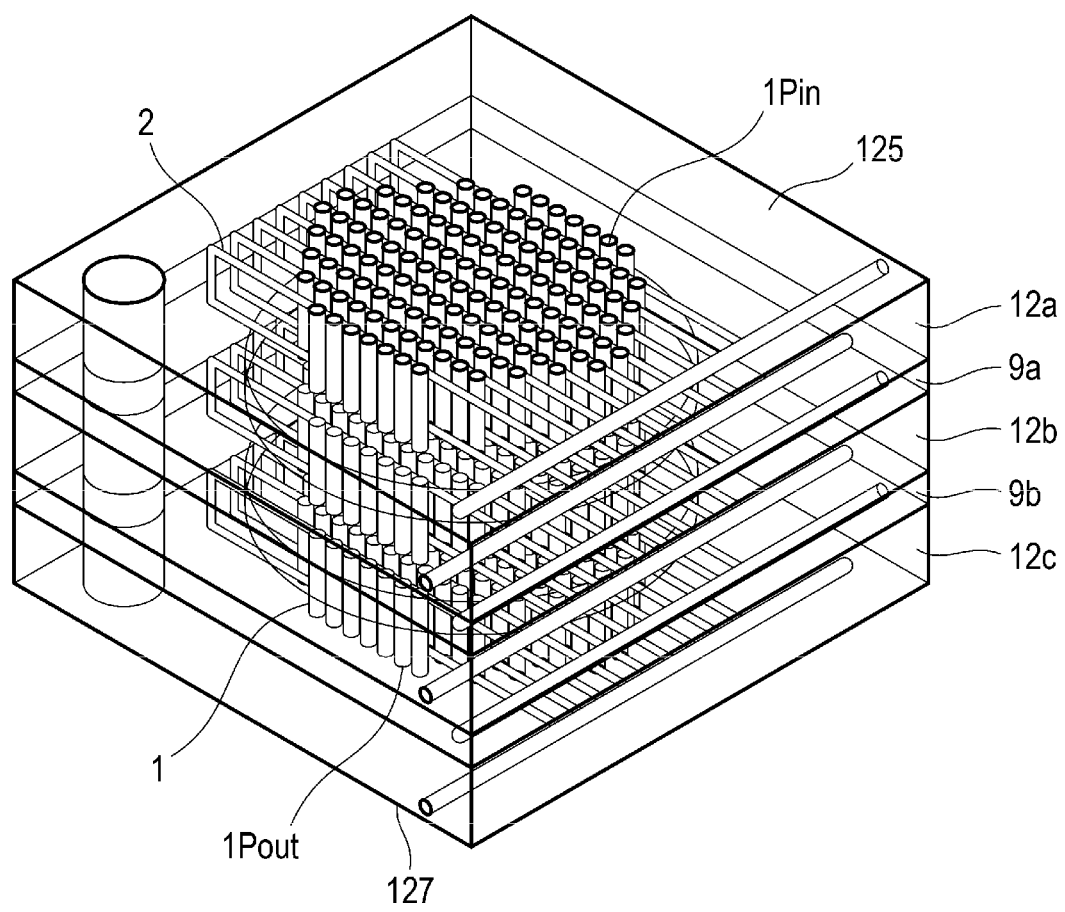
FIG. 6 is a schematic perspective view showing another embodiment of the main part that the vaporizer of the invention may have.
Figure 7:
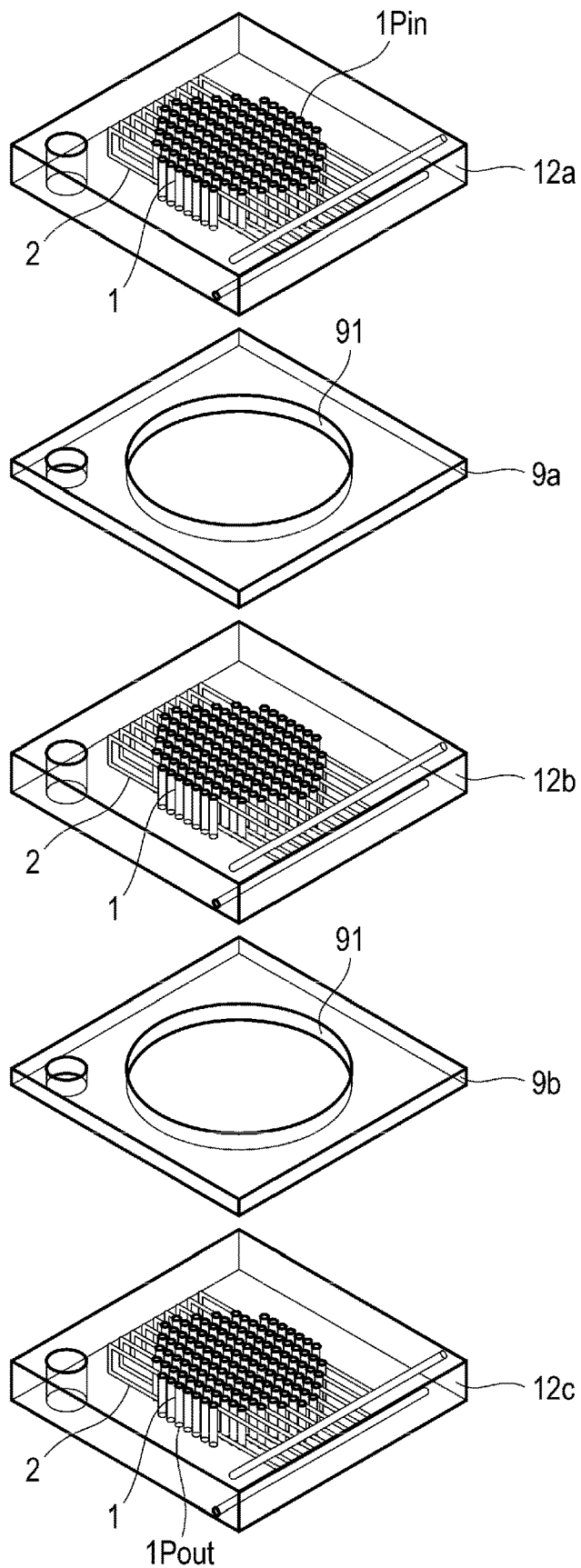
FIG. 7 is a schematic perspective view showing the main part in FIG. 6 in a separated state.

FIG. 6 is a schematic perspective view showing an embodiment in which spacers 9a and 9b are interposed between main parts 12a, 12b, and 12c, and FIG. 7 is a schematic perspective view showing them in a separated state.

The spacers 9a and 9b may each have, for example, a plate-like shape, and a through-hole 91 extending from one main surface to the other main surface is formed. All the mist of material discharged from the main part 12a is collected in the through-hole 91 formed in the spacer 9a to make the temperature, component, and the like of the mist of material more uniform.

When the main part is configured to be separable into some sections as shown in FIG. 6 and FIG. 7, it is easy to clean the interiors of the first flow paths and the like as needed.

FIG. 6 and FIG. 7 illustrate a case including three main parts and two spacers. The numbers of the main parts and spacers are not particularly limited. Naturally, no spacer may be included as in the embodiment shown in FIG. 4.

The spacers are preferably made of the same material as the main parts. However, the spacers may be made of a different metal from the main part, an organic substance or the like.

The heat medium flowing through the second flow paths 2 is not particularly limited as long as it is a fluid with which the mist of material flowing through the first flow paths can be heated. Examples of the heat medium include heating steam and oil. The temperature of the heat medium is also not particularly limited. For example, oil at 200 to 300° C. can be used as the heat medium.

As shown in FIG. 4 to FIG. 7, the mist of material supplied from the supply part 14 enters the interiors of the plurality of first flow paths 1 from the inlets 1Pin of the first flow paths 1 formed at the surface of the main part 12. Then, the mist of material receives heat from the heat medium in the second flow paths 2 in the process of moving in the interiors of the first flow paths 1 toward outlets 1Pout, and is in principle in the form of a gas when discharged from the outlets 1Pout.

In the vaporizer of the invention, the main part is made of a metallic material. For example, the main part may be made of metallic materials such as corrosion-resistant alloys (titanium, Inconel, Hastelloy (nickel-based alloy), and stainless steel (e.g., SUS316L)). In other words, the main part is not configured by a combination of a metallic material and a plastic material.

The main part may be made of two or more metallic materials but is preferably made of one metallic material.

The main part which is made of the metallic material as described above and includes in its interior fine flow paths can be manufactured by a method including a step which involves bringing main surfaces of metallic plates into close contact with each other and joining them by diffusion bonding.

In principle, voids other than the first flow paths or the second flow paths do not exist inside the main part. Therefore, voids other than the second flow paths do not exist in the interior of the main part between one first flow path and other first flow paths present next thereto.

This is described using FIG. 8 to FIG. 12.

Figure 8:
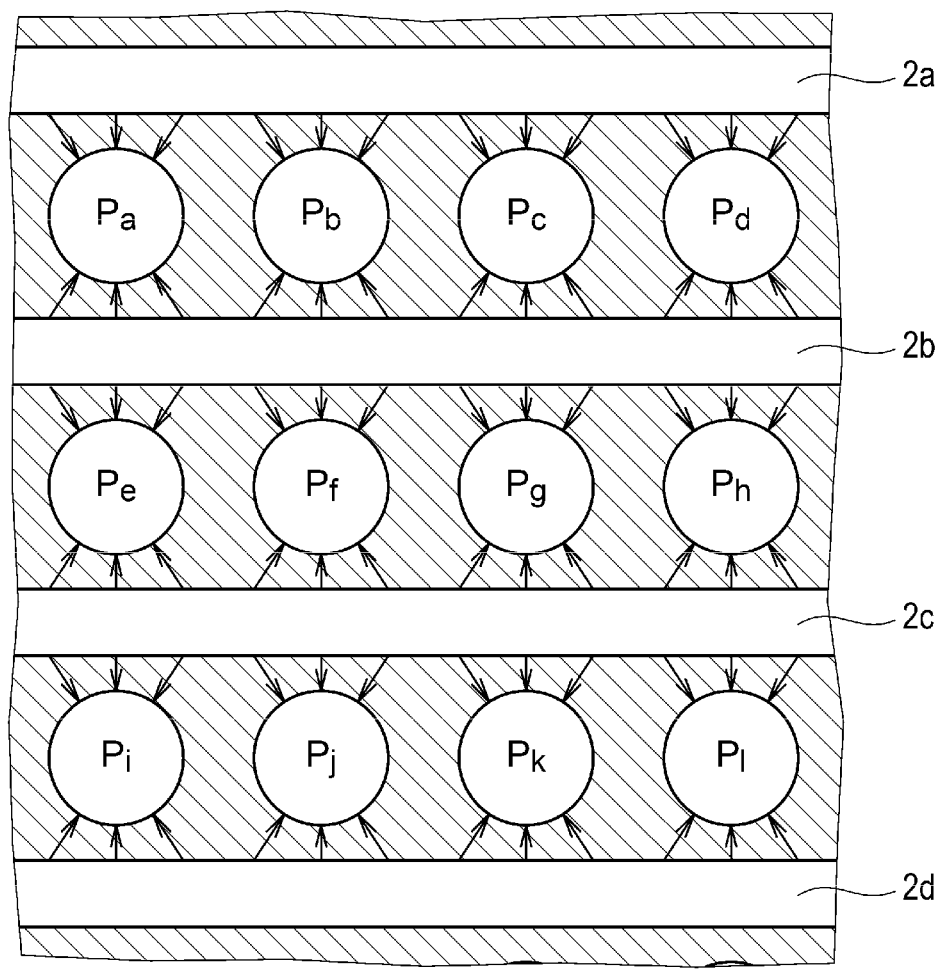
FIG. 8 is a schematic view showing an embodiment of a cross-section of the main part in the vaporizer of the invention.
Figure 9:
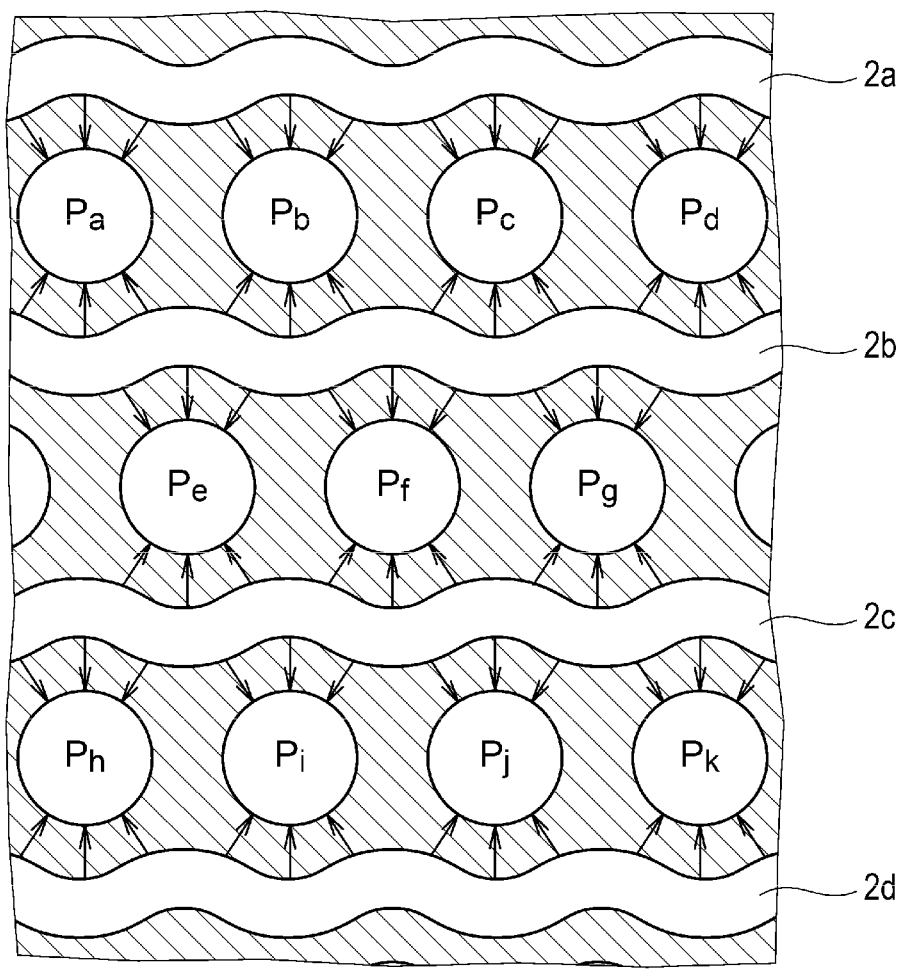
FIG. 9 is a schematic view showing another embodiment of the cross-section of the main part in the vaporizer of the invention.

Each of FIG. 8, FIG. 10, FIG. 11 and FIG. 12 shows a case where the first flow paths and the second flow paths intersect each other at right angles. FIG. 9 shows an embodiment in which the linear second flow paths in FIG. 8 are replaced by meandering flow paths.

FIG. 8 shows a cross-section vertical to the first flow paths (cross-section horizontal to the second flow paths) in the main part of the vaporizer of the invention. FIG. 8 may be deemed to be a partially enlarged view of FIG. 5. In the embodiment shown in FIG. 8, holes of the first flow paths are denoted by Pa, Pb, Pc, Pd, Pe, Pf, Pg, Ph, Pi, Pj, Pk, and Pl, respectively. In FIG. 8, the second flow paths are denoted by 2a, 2b, 2c, and 2d, respectively. Shaded areas in FIG. 8 mean that a metallic material is present. In other words, in FIG. 8, the voids are only the first flow paths and the second flow paths.

In FIG. 8, for example, holes of other first flow paths present next to the hole Pf of the first flow path are the holes Pa, Pb, Pc, Pe, Pg, Pi, Pj, and Pk.

As is clear from FIG. 8, the portion between the hole Pe or Pg and the hole Pf is filled with a metallic material and no void is present.

A second flow path is present between any of the holes Pa, Pb, Pc, Pi, Pj and Pk, and the hole Pf. However, no other voids are present.

Arrows in FIG. 8 conceptually show transfer of heat. According to the embodiment shown in FIG. 8, heat transfer from the heat medium in the second flow paths (2a, 2b, 2c, 2d) to the mist of material in the first flow paths is performed with high efficiency.

FIG. 9 shows a cross-section vertical to the first flow paths in the main part of the vaporizer of the invention. FIG. 9 shows the embodiment in which the above-mentioned linear second flow paths in FIG. 8 are replaced by meandering flow paths.

In the embodiment shown in FIG. 9, holes of the first flow paths are denoted by Pa, Pb, Pc, Pd, Pe, Pf, Pg, Ph, Pi, Pj, and Pk, respectively. In FIG. 9, the second flow paths are denoted by 2a, 2b, 2c, and 2d, respectively. Shaded areas in FIG. 9 mean that a metallic material is present. In other words, in FIG. 9, the voids are only the first flow paths and the second flow paths.

In FIG. 9, for example, holes of other first flow paths present next to the hole Pf of the first flow path are the holes Pb, Pc, Pe, Pg, Pi, and Pj.

Also in this case, as in the embodiment shown in FIG. 8, the portion between any of the holes Pb, Pc, Pe, Pg, Pi and Pj, and the hole Pf is filled with a metallic material or only includes the second flow path (2b or 2c).

Arrows in FIG. 9 conceptually show transfer of heat. According to the embodiment shown in FIG. 9, heat transfer from the heat medium in the second flow paths (2a, 2b, 2c, 2d) to the mist of material in the first flow paths is performed with high efficiency.

Figure 10:
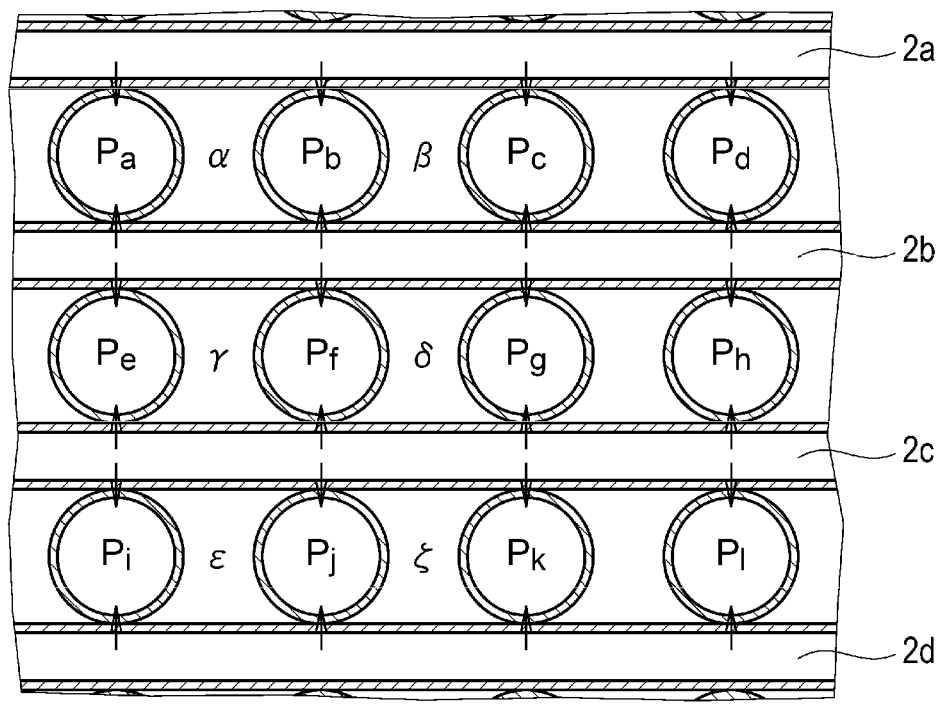
FIG. 10 is a schematic view showing an embodiment of a cross-section of a main part which does not correspond to the vaporizer of the invention.

FIG. 10 does not correspond to the main part of the vaporizer of the invention.

In FIG. 10, the first flow paths and the second flow paths each having a tubular shape are assembled in a grid pattern and fixed at their contact points.

In the embodiment shown in FIG. 10, holes of the first flow paths are denoted by Pa, Pb, Pc, Pd, Pe, Pf, Pg, Ph, Pi, Pj, Pk, and Pl, respectively. In FIG. 10, the second flow paths are denoted by 2a, 2b, 2c, and 2d, respectively.

In FIG. 10, for example, holes of other first flow paths present next to the hole Pf of the first flow path are the holes Pa, Pb, Pc, Pe, Pg, Pi, Pj, and Pk.

As is clear from FIG. 10, a void γ is present between the hole Pf and the hole Pe. Further, a void δ is also present between the hole Pf and the hole Pg.

Arrows in FIG. 10 conceptually show transfer of heat. According to the embodiment shown in FIG. 10, heat transfer from the heat medium in the second flow paths (2a, 2b, 2c, 2d) to the mist of material in the first flow paths is only performed at the points of contact between the second flow paths and the first flow paths. Therefore, heat transfer efficiency is low.

Figure 11:
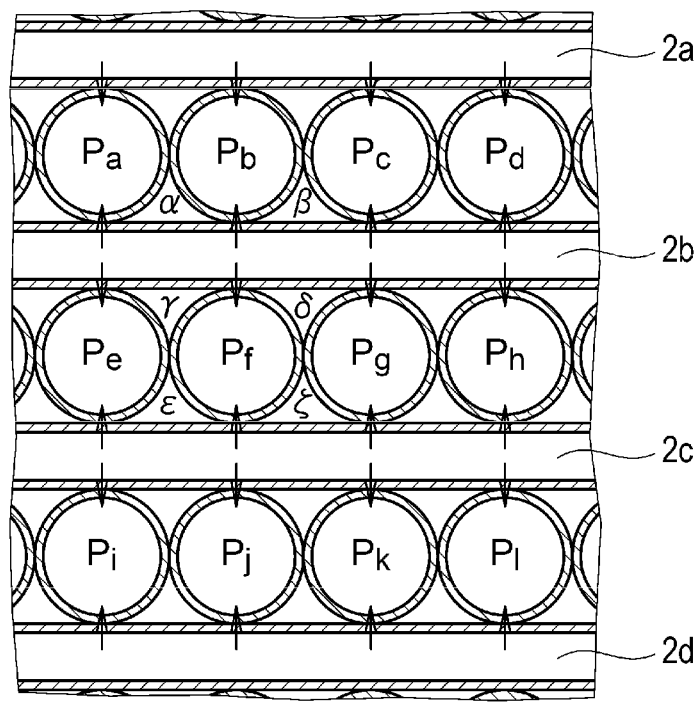
FIG. 11 is a schematic view showing another embodiment of the cross-section of the main part which does not correspond to the vaporizer of the invention.

FIG. 11 does not correspond to the main part of the vaporizer of the invention.

In FIG. 11, the first flow paths and the second flow paths each having a tubular shape are assembled in a grid pattern and fixed at their contact points in the same manner as the above-mentioned case of FIG. 10. Further, the first flow paths are also fixed to each other at their contact points.

In the embodiment shown in FIG. 11, holes of the first flow paths are denoted by Pa, Pb, Pc, Pd, Pe, Pf, Pg, Ph, Pi, Pj, Pk, and Pl, respectively. In FIG. 11, the second flow paths are denoted by 2a, 2b, 2c, and 2d, respectively.

In FIG. 11, for example, holes of other first flow paths present next to the hole Pf of the first flow path are the holes Pa, Pb, Pc, Pe, Pg, Pi, Pj, and Pk.

As is clear from FIG. 11, voids α and γ are present between the hole Pf and the hole Pa. Voids γ and ε are present between the hole Pf and the hole Pe.

Arrows in FIG. 11 conceptually show transfer of heat. According to the embodiment shown in FIG. 11, heat transfer from the heat medium in the second flow paths (2a, 2b, 2c, 2d) to the mist of material in the first flow paths is only performed at the points of contact between the second flow paths and the first flow paths. Therefore, heat transfer efficiency is low.

Figure 12:
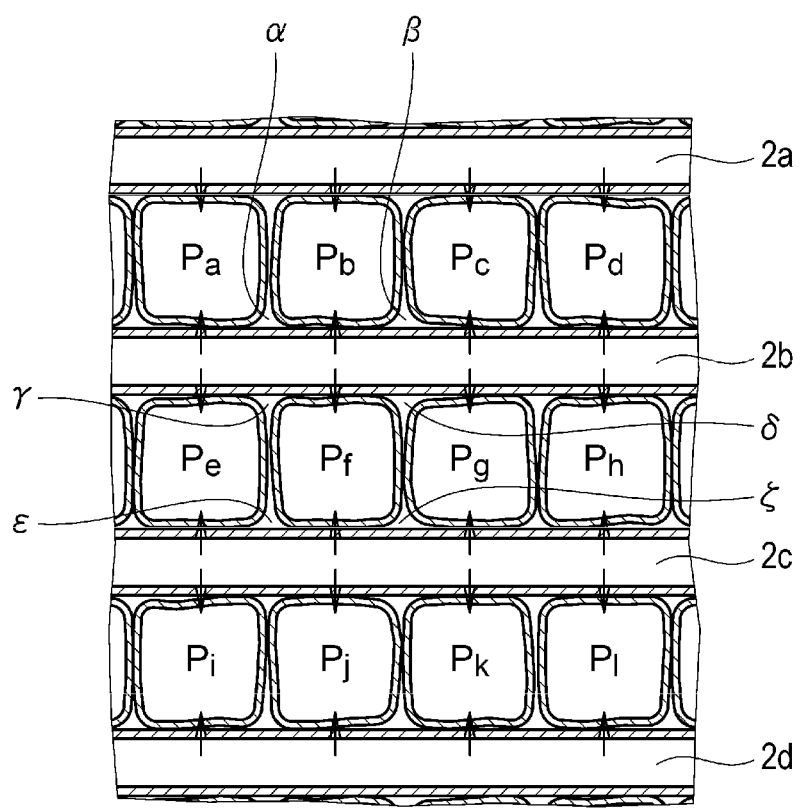
FIG. 12 is a schematic view showing still another embodiment of the cross-section of the main part which does not correspond to the vaporizer of the invention.

FIG. 12 does not correspond to the main part of the vaporizer of the invention.

The point in which the embodiment shown in FIG. 12 is different from the above-mentioned embodiment shown in FIG. 11 is the cross-sectional shape of the first flow paths. That is, the first flow paths in the embodiment shown in FIG. 11 have a circular cross-sectional shape but the first flow paths in the embodiment shown in FIG. 12 have a rectangular cross-sectional shape. The embodiment shown in FIG. 12 is the same as that shown in FIG. 11 except this point, and the first flow paths and the second flow paths each having a tubular shape are assembled in a grid pattern and fixed at their contact points. Further, the first flow paths are also fixed to each other at their contact points.

In the case of such a configuration, the voids tend to be reduced as compared to the embodiment shown in FIG. 11. However, even if the pipes are brought into close contact with each other, certain voids are formed therebetween as shown in FIG. 12. In FIG. 12, for example, voids α, β, γ, δ, ε and ζ are present.

In the embodiment shown in FIG. 12, holes of the first flow paths are denoted by Pa, Pb, Pc, Pd, Pe, Pf, Pg, Ph, Pi, Pj, Pk, and Pl, respectively. In FIG. 12, the second flow paths are denoted by 2*a*, 2*b*, 2*c*, and 2*d*, respectively.

In FIG. 12, for example, holes of other first flow paths present next to the hole Pf of the first flow path are the holes Pa, Pb, Pc, Pe, Pg, Pi, Pj, and Pk.

As is clear from FIG. 11, voids α and γ are present between the hole Pf and the hole Pa. Voids γ and ε are present between the hole Pf and the hole Pe.

Arrows in FIG. 12 conceptually show transfer of heat. According to the embodiment shown in FIG. 12, heat transfer from the heat medium in the second flow paths (2*a*, 2*b*, 2*c*, 2*d*) to the mist of material in the first flow paths is only performed at the points of contact between the second flow paths and the first flow paths. Therefore, heat transfer efficiency is low.

As described with reference to FIG. 8 to FIG. 12, in the vaporizer of the invention, voids other than the second flow paths do not exist in the interior of the main part between one first flow path and other first flow paths present next thereto. Therefore, heat transfer from the heat medium in the second flow paths to the mist of material in the first flow paths is performed with high efficiency.

The first flow paths present in the interior of the main part of the vaporizer of the invention have a cross-sectional diameter in terms of equal area circle equivalent diameter of 5 mm or less and preferably 2 mm or less. The cross-sectional diameter is preferably 1 mm or more.

The equal area circle equivalent diameter in the invention means a diameter of a perfect circle having an area equivalent to that of the cross-sectional shape of a first flow path. The equal area circle equivalent diameter of the second flow paths also has the same meaning.

The cross-sectional size of the first flow paths falling within the above range is preferred in terms of the balance between pressure loss and heat-transfer performance, and less obstruction due to deposits.

There is no particular limitation on the cross-sectional shape of the first flow paths. The shape may be circular, elliptic or rectangular.

The second flow paths present in the interior of the main part of the vaporizer of the invention have a cross-sectional diameter in terms of equal area circle equivalent diameter of 2 mm or less and preferably 1 mm or less. The cross-sectional diameter is preferably 0.5 mm or more.

The cross-sectional size of the second flow paths falling within the above range is preferred in terms of the balance between pressure loss and heat-transfer performance.

There is no particular limitation on the cross-sectional shape of the second flow paths. The shape may be circular, elliptic or rectangular.

The vaporizer of the invention is preferably in the following embodiment: When a direction in which the heat medium flows in a serpentine manner is taken as a horizontal direction in a cross-section of the main part in a vertical direction with respect to a direction in which the mist of material flows, holes of the first flow paths are arranged in line in the horizontal direction, and hole rows are arranged to form layers in a vertical direction, the second flow paths are present between vertically adjacent hole row layers, respectively, the second flow paths are not connected to the first flow paths, and the second flow paths vertically meander so as to avoid the holes of the first flow paths in the hole row layers between which the second flow paths are sandwiched in the vertical direction, respectively.

As the vaporizer of the invention corresponding to the preferred embodiment as described above, Embodiment 1, Embodiment 2, and Embodiment 3 are illustrated below.

Figure 13:
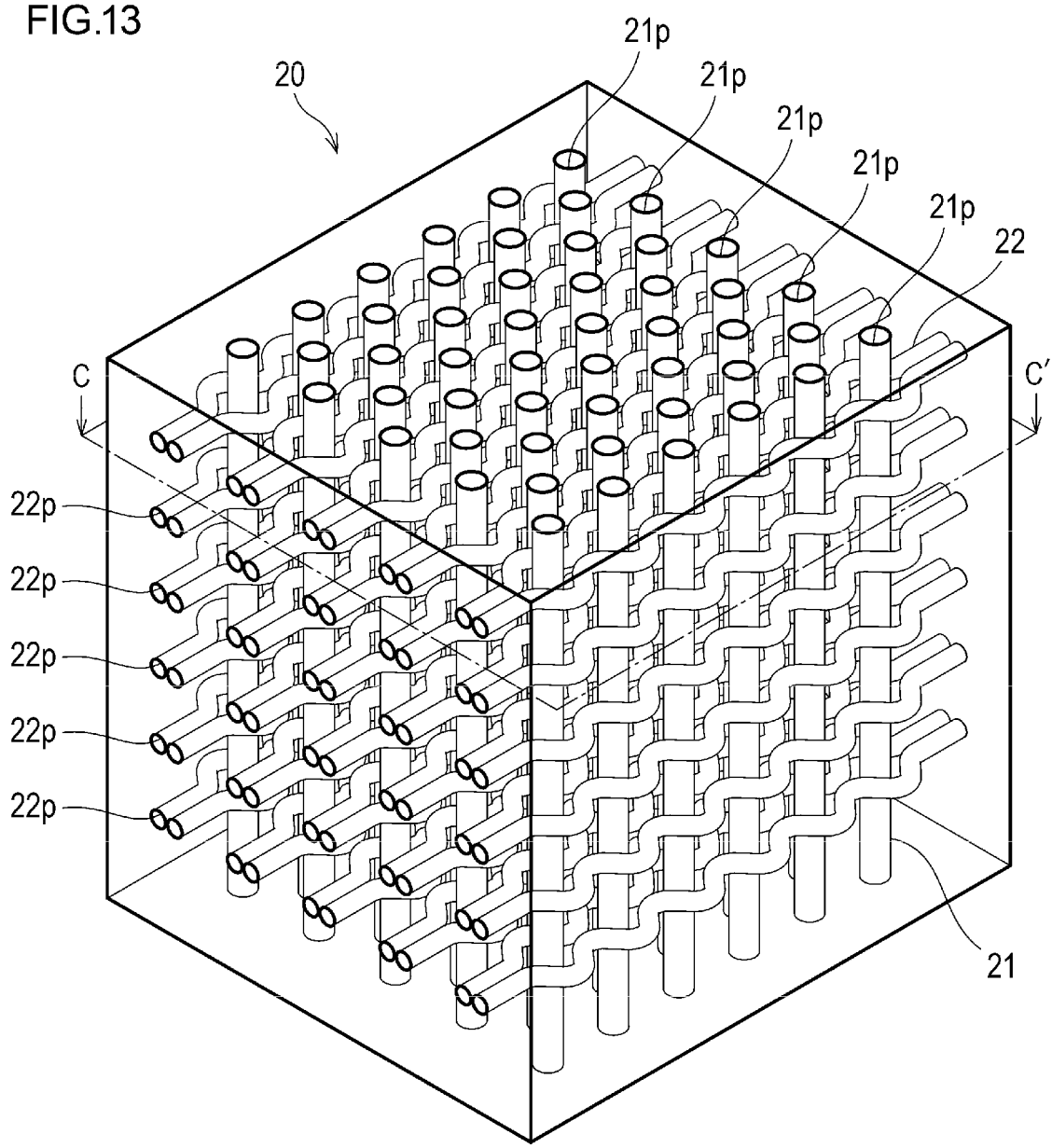
FIG. 13 is a schematic perspective view showing another embodiment of the main part that the vaporizer of the invention may have.
Figure 14:
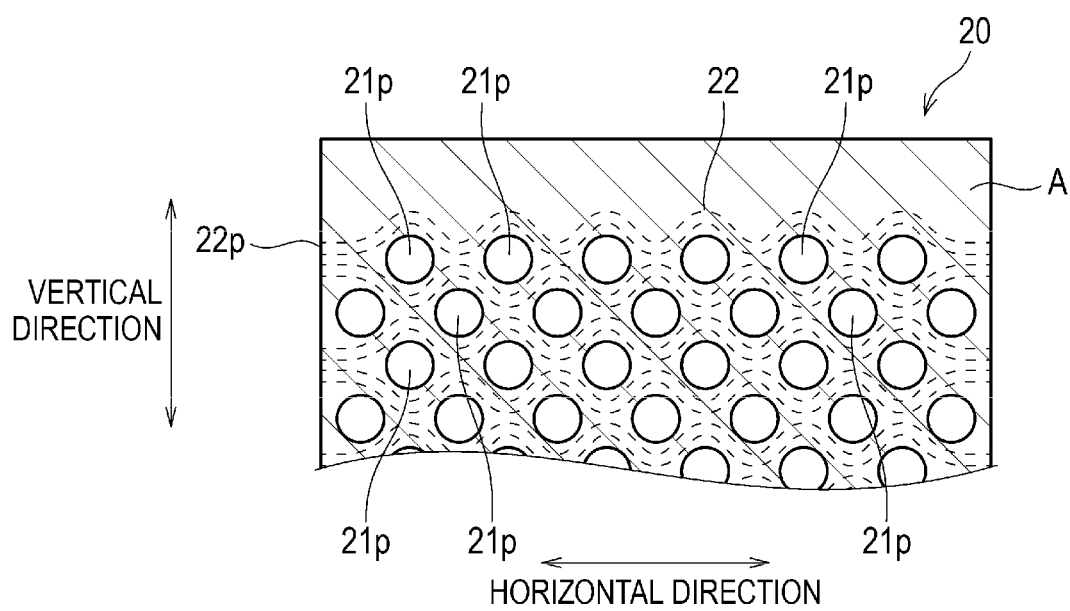
FIG. 14 is a cross-sectional view taken along line C-C' in the embodiment shown in FIG. 13.
Figure 15:
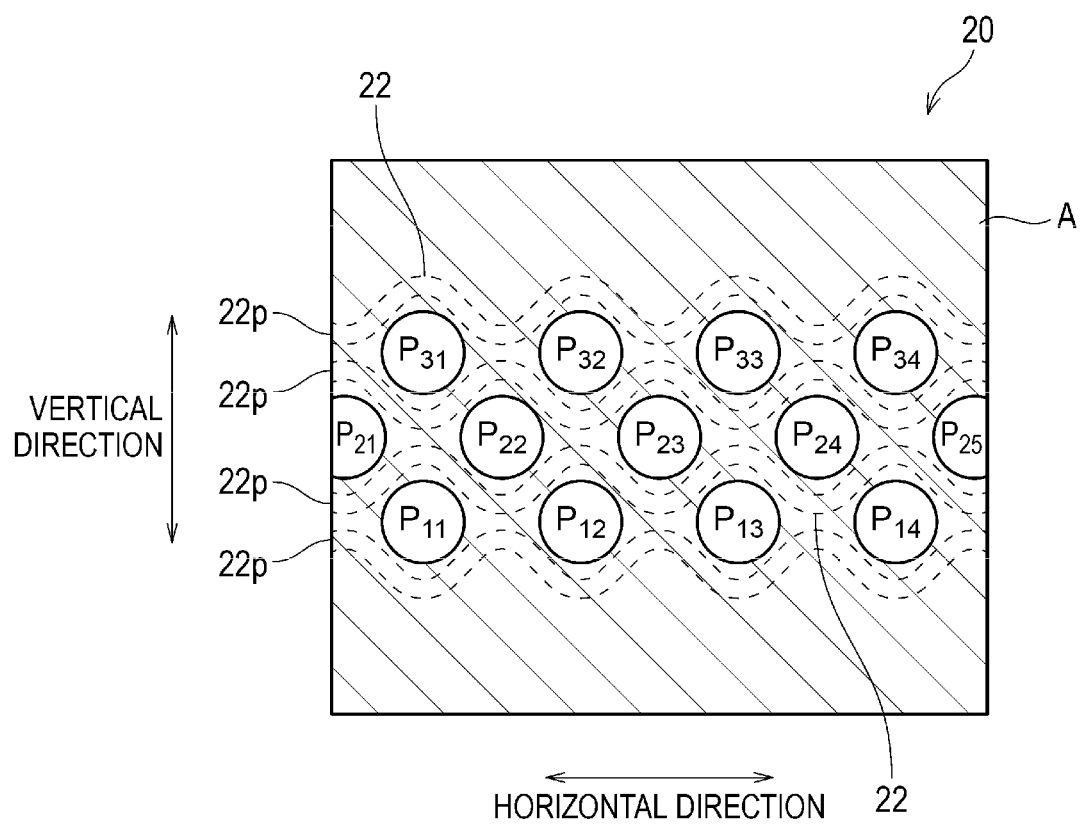
FIG. 15 is a cross-sectional view taken along line C-C' in the embodiment shown in FIG. 13.

Embodiment 1 is described using FIG. 13 to FIG. 15.

FIG. 13 is a schematic perspective view showing a preferred embodiment (Embodiment 1) of the main part in the vaporizer of the invention. FIG. 14 shows a cross-sectional view taken along line C-C' in FIG. 13.

In a main part 20 of Embodiment 1 shown in FIG. 13, as shown in FIG. 13, second flow paths 22 are formed on a plane perpendicular to first flow paths 21, and the second flow paths 22 meander so as to avoid the first flow paths.

In FIG. 13 and FIG. 14, "21*p*" denotes an inlet hole or outlet hole of each first flow path, or a hole of each first flow path emerging at the cross-section, and "22*p*" denotes an inlet hole or outlet hole of each second flow path.

The main part 20 in the preferred embodiment (Embodiment 1) to be described using FIG. 13 to FIG. 15 is capable of obtaining a cross-section A satisfying [Requirement 1] to [Requirement 3] described below.

Requirement 1

In the main part 20 illustrated in FIG. 13 and FIG. 14, the cross-section A illustrated in FIG. 14 can be obtained by cutting the main part 20 in the vertical direction with respect to the direction in which the mist of material flows (when the first flow paths linearly extend in the vertical direction, this direction is applied).

The cross-section A may not be a cross-section in a direction perpendicular to all the first flow paths in the main part 20. Depending on the configuration of the first flow paths, a cross-section perpendicular to all the first flow paths may not be obtained. In such a case, a cross-section in a direction perpendicular to some first flow paths in the main part 20 (to the largest possible number of the first flow paths in the main part 20) is taken as the cross-section A in the main part 20.

For instance, in the case of the main part 20 shown in FIG. 13, the first flow paths 21 are linearly formed and therefore a cross-section in a direction perpendicular to the flow paths, that is, a cross-section taken along line C-C' in FIG. 13 is the cross-section A and is shown in FIG. 14.

For ease of understanding, the first flow paths and the second flow paths in FIG. 13 and FIG. 14 are shown as flow paths having extremely simple configurations, respectively. For instance, the second flow paths may be connected to other second flow paths at their horizontal ends.

Requirement 2

FIG. 15 is used to describe Requirement 2. FIG. 15 shows the cross-section A which is similar to that in FIG. 14. The holes of the first flow paths are denoted by "21*p*" in FIG. 14 but are denoted by "$P_{mk}$" (m and k are integers of 1 or more, respectively) in FIG. 15.

In the main part 20, as illustrated in FIG. 15, when a direction in which the heat medium flows in a serpentine manner in the cross-section A is taken as a horizontal direction, holes ($P_{mk}$) of the first flow paths are arranged in line in the horizontal direction, and hole rows are arranged to form layers in a vertical direction. In FIG. 15, the holes ($P_{mk}$) are horizontally arranged in line and three hole layers each forming a hole row are present in the vertical direction. Then, the hole row layers are expressed, from below to above, by first layer, second layer, and third layer, respectively, and holes in the first layer, second layer and third layer are denoted by $P_{1k}$, $P_{2k}$, and $P_{3k}$, respectively. That is, m denotes the layer number. In each layer, the holes are expressed, from left to right, by $P_{m1}$, $P_{m2}$, $P_{m3}$, . . . $P_{mk}$, respectively. That is, k is a hole (serial) number in a single layer. The hole $P_{3k}$ in the third layer should be present just above the hole $P_{1k}$ present in the first layer. For instance, the hole $P_{33}$ in the third layer should be present just above the hole $P_{13}$ present in the first layer. The hole $P_{2k}$ in the second layer should be present at the upper left of the hole $P_{1k}$ present in the first layer. For instance, the hole $P_{23}$ in the second layer should be present at the upper left of the hole $P_{13}$ present in the first layer.

In such a case, the first and second layers, and the second and third layers form the hole row layers vertically adjacent to each other, respectively, and in the first and second layers adjacent to each other, the holes of the first flow paths are not located at the same positions in the horizontal direction. In other words, the center of each hole in the second layer is not present just above the center of each hole in the first layer. Each hole in the second layer is present between two holes in the first layer. Also in the second and third layers adjacent to each other, the holes of the second flow paths are not located at the same positions in the horizontal direction. In other words, the center of each hole in the third layer is not present just above the center of each hole in the second layer. Each hole in the third layer is present between two holes in the second layer.

Requirement 3

In the main part 20, as shown in FIG. 14 and FIG. 15, the second flow paths 22 are present between the vertically adjacent hole row layers, respectively.

The first flow paths 21 are not connected to the second flow paths 22.

The second flow paths 22 vertically meander so as to avoid the holes ($21p$, $P_{mk}$) of the first flow paths in the hole row layers between which the second flow paths are sandwiched in the vertical direction, respectively.

For instance, in FIG. 15, a second flow path 22 is present between a first layer having holes ($P_{11}$, $P_{12}$, $P_{13}$, $P_{14}$) of first flow paths and a second layer having holes ($P_{21}$, $P_{22}$, $P_{23}$, $P_{24}$, $P_{25}$) of second flow paths, and the second flow path vertically meanders so as to avoid the holes ($P_{11}$, $P_{12}$, $P_{13}$, $P_{14}$) of the first layer and the holes ($P_{21}$, $P_{22}$, $P_{23}$, $P_{24}$, $P_{25}$) of the second layer.

As shown in FIG. 15, a band portion that forms a boundary between the first and second layers meanders vertically, and the corresponding second flow path meanders along the shape of the band portion.

Figure 16:
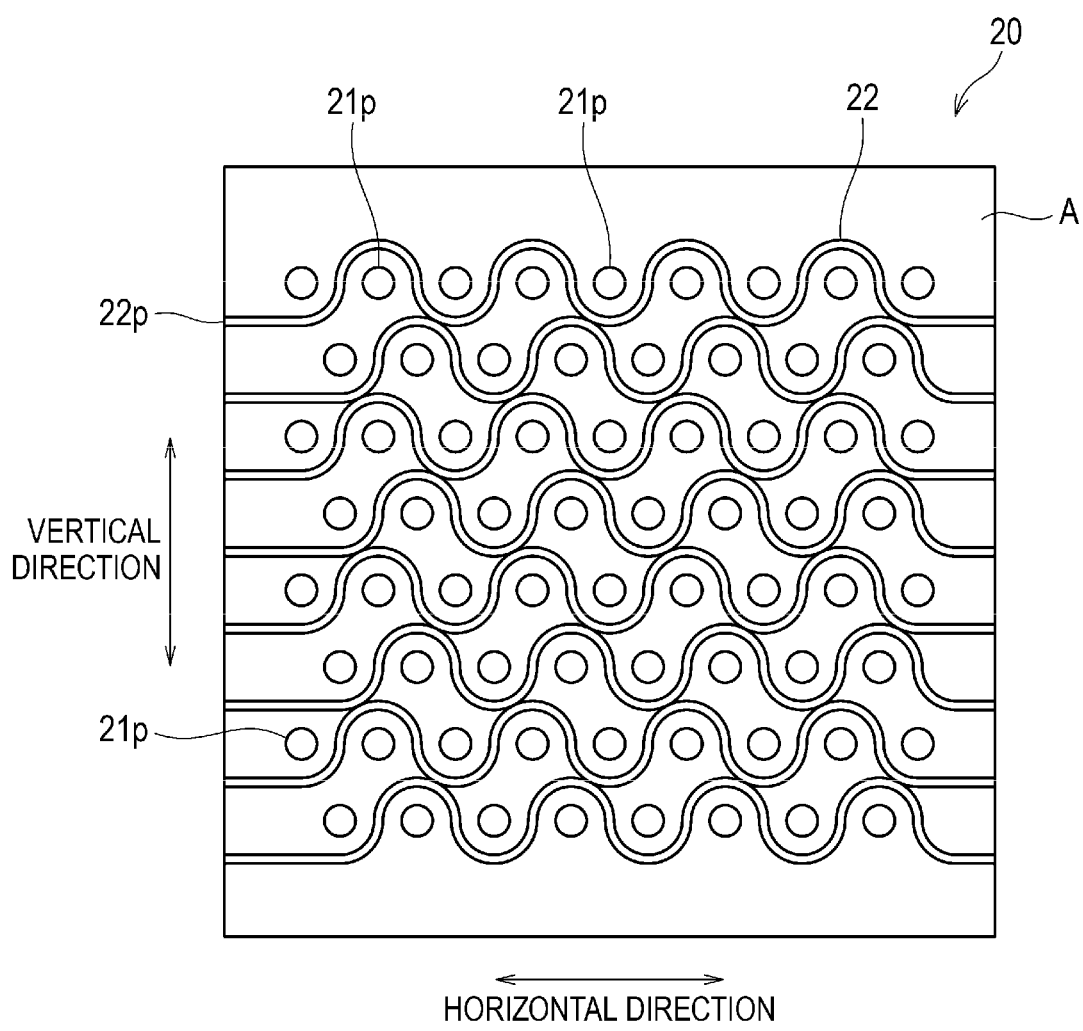
FIG. 16 is a schematic view showing a cross-section in another embodiment of the main part that the vaporizer of the invention may have.

Embodiment 2 is described using FIG. 16.

FIG. 16 shows a cross-section which is similar to FIG. 14 showing the cross-section in Embodiment 1.

The vaporizer of the invention is in the following embodiment: When a direction in which the heat medium flows in a serpentine manner is taken as a horizontal direction in a cross-section A of the main part 20 in a vertical direction with respect to a direction in which the mist of material flows, holes $21p$ of the first flow paths are arranged in line in the horizontal direction, and hole rows are arranged to form layers in a vertical direction, and in addition, when vertically adjacent hole row layers are compared with each other, the holes $21p$ of the first flow paths are not arranged at the same positions in the horizontal direction, the second flow paths 22 are not connected to the first flow paths 21, and the second flow paths 22 vertically meander so as to avoid the holes $21p$ of the first flow paths in the hole row layers between which the second flow paths 22 are sandwiched in the vertical direction, respectively.

Figure 17:
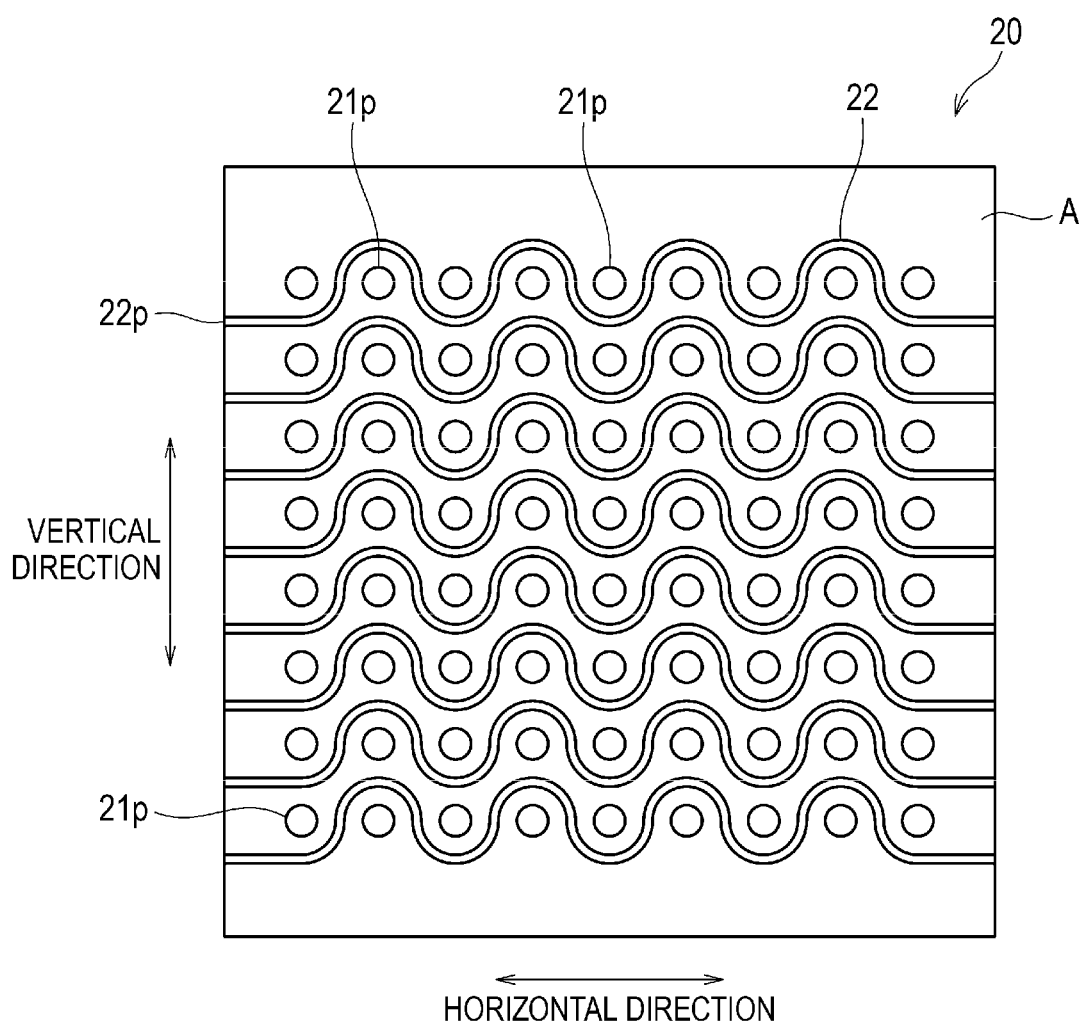
FIG. 17 is a schematic view showing a cross-section in still another embodiment of the main part that the vaporizer of the invention may have.

Embodiment 3 is described using FIG. 17.

FIG. 17 shows a cross-section which is similar to FIG. 14 showing the cross-section in Embodiment 1.

The vaporizer of the invention is in the following embodiment: When a direction in which the heat medium flows in a serpentine manner is taken as a horizontal direction in a cross-section A of the main part 20 in a vertical direction with respect to a direction in which the mist of material flows, holes $21p$ of the first flow paths are arranged in line in the horizontal direction, and hole rows are arranged to form layers in a vertical direction, the second flow paths 22 are not connected to the first flow paths 21, and the second flow paths 22 vertically meander so as to avoid the holes $21p$ of the first flow paths in the hole row layers between which the second flow paths 22 are sandwiched in the vertical direction, respectively.

The vaporizer of the invention is preferably configured so that, when each of the first flow paths is separated into a plurality of sections in its longitudinal direction, the temperature of the mist of material present inside each of the first flow paths is adjustable for each of the sections.

This is because, when the gaseous material for film formation is produced in this manner, the amount of formed deposits is more reduced.

Next, such a preferred embodiment is described.

For instance, in FIG. 4, a surface in the main part 12 at which the holes 1Pin for flowing the mist of material thereinto are formed is referred to as an inlet side surface 125. A surface in the main part 12 at which the holes 1Pout for discharging the gaseous material are formed is referred to as an outlet side surface 127.

In this case, if the pathway for flowing the heat medium to the second flow paths in the section close to the inlet side surface 125 in the main part 12 and the pathway for flowing the heat medium to the second flow paths in the section close to the outlet side surface 127 in the main part 12 are configured separately, the temperature of the heat medium for flowing to the second flow paths in the section close to the inlet side surface 125 in the main part 12 can be made different from the temperature of the heat medium for flowing to the second flow paths in the section close to the outlet side surface 127 in the main part 12. In this case, the temperature of the mist of material present inside the first flow paths 1 in the section close to the inlet side surface 125 in the main part 12 and the temperature of the mist of material present inside the first flow paths 1 in the section close to the outlet side surface 127 in the main part 12 can be adjusted for each section.

For instance, if the pathway for flowing the heat medium to the second flow paths in the section close to the inlet side surface 125 in the main part 12 and the pathway for flowing the heat medium to the second flow paths in the section close to the outlet side surface 127 in the main part 12 are configured separately so that a heat medium having a relatively high temperature is circulated in the pathway for flowing the heat medium to the second flow paths in the section close to the inlet side surface 125 in the main part 12, and a heat medium having a relatively low temperature is circulated in the pathway for flowing the heat medium to the second flow paths in the section close to the outlet side surface 127 in the main part 12, the temperature of the heat medium in the second flow paths which is present in its interior can be gradually reduced from the inlet side surface 125 toward the outlet side surface 127. In this case, the temperature of the mist of material having flowed from the holes 1Pin into the first flow paths is gradually reduced in the process of moving toward the holes 1Pout.

For instance, if the embodiment shown in FIG. 6 and FIG. 7 which is configured so that the main part is separable is configured so that the temperature of the heat medium flowing in the second flow paths inside the main part 12a, the main part 12b, and the main part 12c can be separately adjusted, the temperature of the mist of material present in the interiors thereof can be adjusted for each section of the main part 12a, the main part 12b, and the main part 12c. For instance, if the temperature of the heat medium in the second flow paths present in the interiors thereof is gradually reduced from the inlet side surface 125 toward the outlet side surface 127, the temperature of the mist of material having flowed from the holes 1Pin into the first flow paths is gradually reduced in the process of moving toward the holes 1Pout.

In the vaporizer of the invention, when the surface in the main part at which the holes for flowing the mist of material thereinto are formed is referred to as the inlet side surface, and the surface in the main part at which the holes for discharging the gaseous material are formed is referred to as the outlet side surface, the equal area circle equivalent diameter of the first flow paths present in its interior preferably varies in a gradual manner from the inlet side surface toward the outlet side surface.

This preferred embodiment is described using FIG. 18 to FIG. 21.

Figure 18:
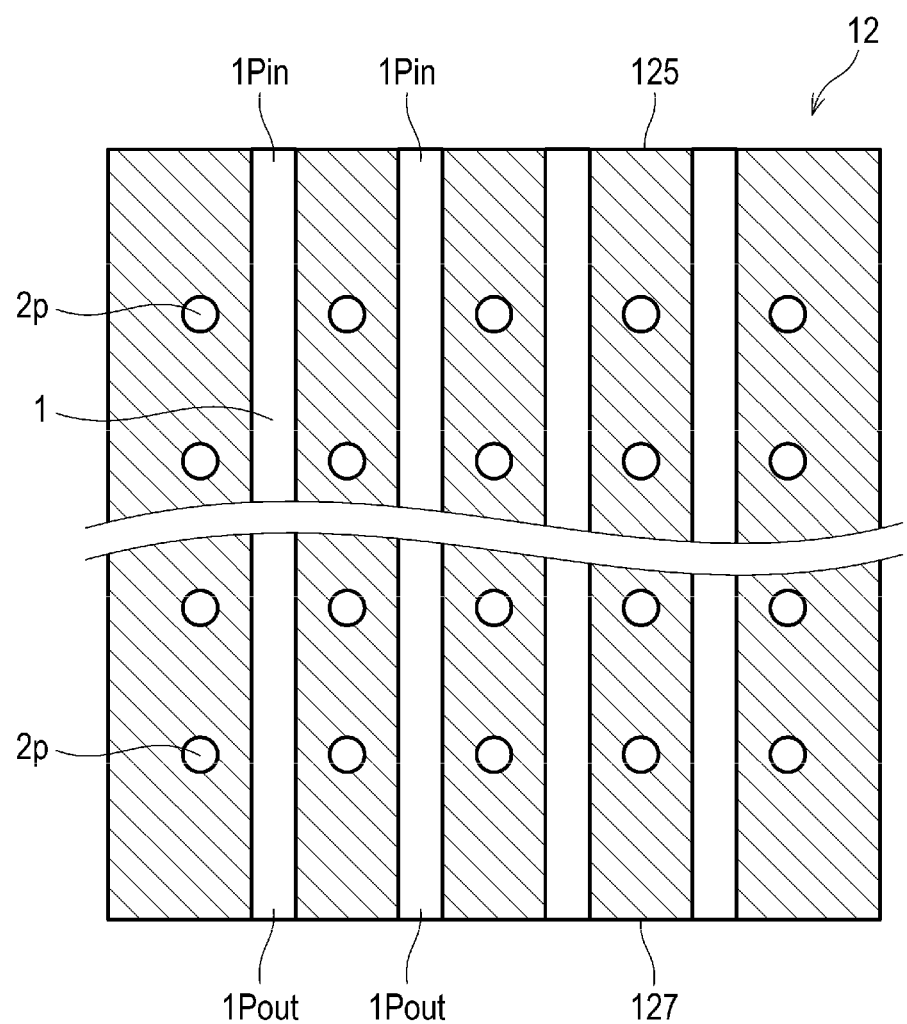
FIG. 18 is a cross-sectional view taken along line D-D' in the embodiment shown in FIG. 4.

FIG. 18 shows a cross-sectional view taken along line D-D' in FIG. 4, and FIG. 19 to FIG. 21 show cross-sectional views in cases where the first flow paths shown in FIG. 18 are replaced by other embodiments (preferred embodiments).

In the main part 12 shown in FIG. 18, the diameter of the first flow paths 1 present in its interior does not vary from the inlet side surface 125 where the holes 1Pin for flowing the mist of material thereinto are formed, toward the outlet side surface 127 where the holes 1Pout for discharging the gaseous material are formed. The first flow paths 1 are linearly formed.

Figure 19:
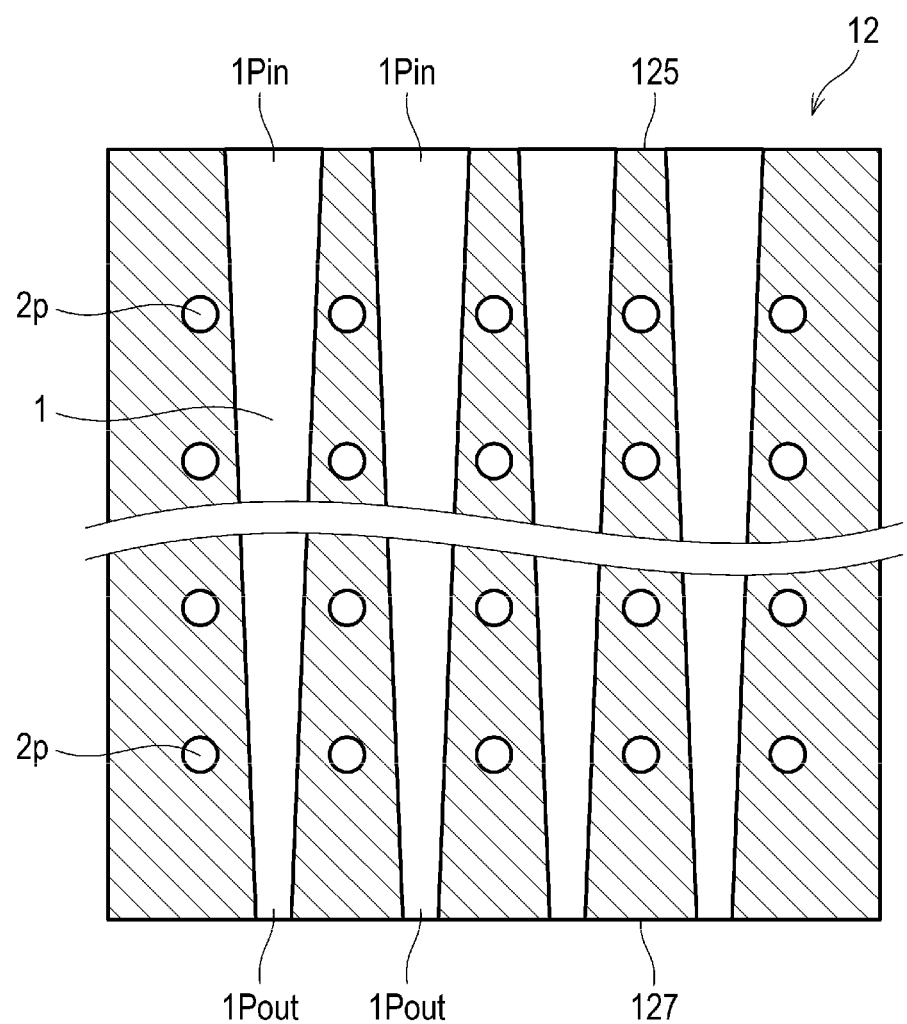
FIG. 19 is a schematic cross-sectional view showing an embodiment by which the embodiment shown in FIG. 18 is replaced for the first flow paths.

In contrast, in the main part 12 shown in FIG. 19, the equal area circle equivalent diameter of the first flow paths present in its interior varies so as to be gradually reduced from the inlet side surface 125 where the holes 1Pin for flowing the mist of material thereinto are formed, toward the outlet side surface 127 where the holes 1Pout for discharging the gaseous material are formed. Such an embodiment is preferred in that increases in temperature of the gaseous material can be controlled to a moderate level.

Figure 20:
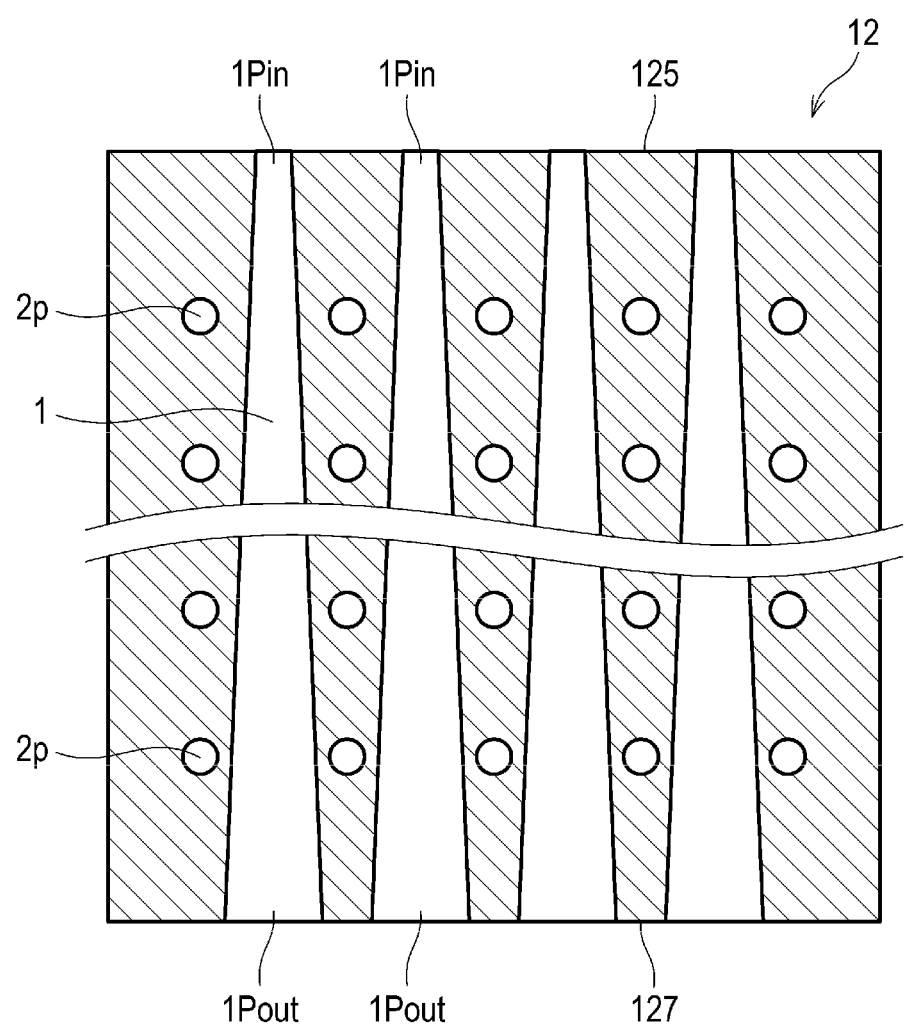
FIG. 20 is a schematic cross-sectional view showing another embodiment by which the embodiment shown in FIG. 18 is replaced for the first flow paths.

In the main part 12 shown in FIG. 20, the equal area circle equivalent diameter of the first flow paths present in its interior varies so as to be gradually increased from the inlet side surface 125 where the holes 1Pin for flowing the mist of material thereinto are formed, toward the outlet side surface 127 where the holes 1Pout for discharging the gaseous material are formed. Such an embodiment is preferred in that the gaseous material can be uniformly distributed to the first flow paths.

Figure 21:
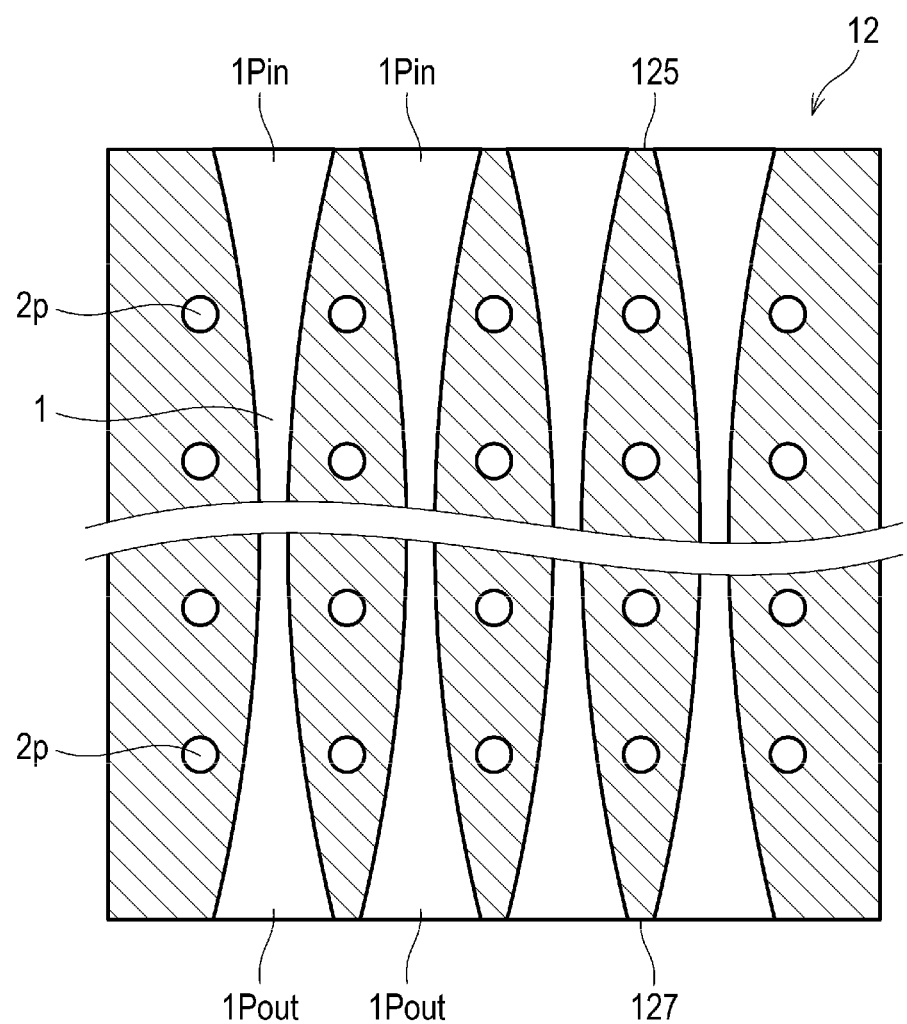
FIG. 21 is a schematic cross-sectional view showing still another embodiment by which the embodiment shown in FIG. 18 is replaced for the first flow paths.

In the main part 12 shown in FIG. 21, the equal area circle equivalent diameter of the first flow paths present in its interior varies so as to be gradually reduced and then increased from the inlet side surface 125 where the holes 1Pin for flowing the mist of material thereinto are formed, toward the outlet side surface 127 where the holes 1Pout for discharging the gaseous material are formed. Such an embodiment is preferred in terms of acceleration of heat transfer resulting from turbulence of the gaseous material and fluid uniformity.

Discharge Part

Figure 22:
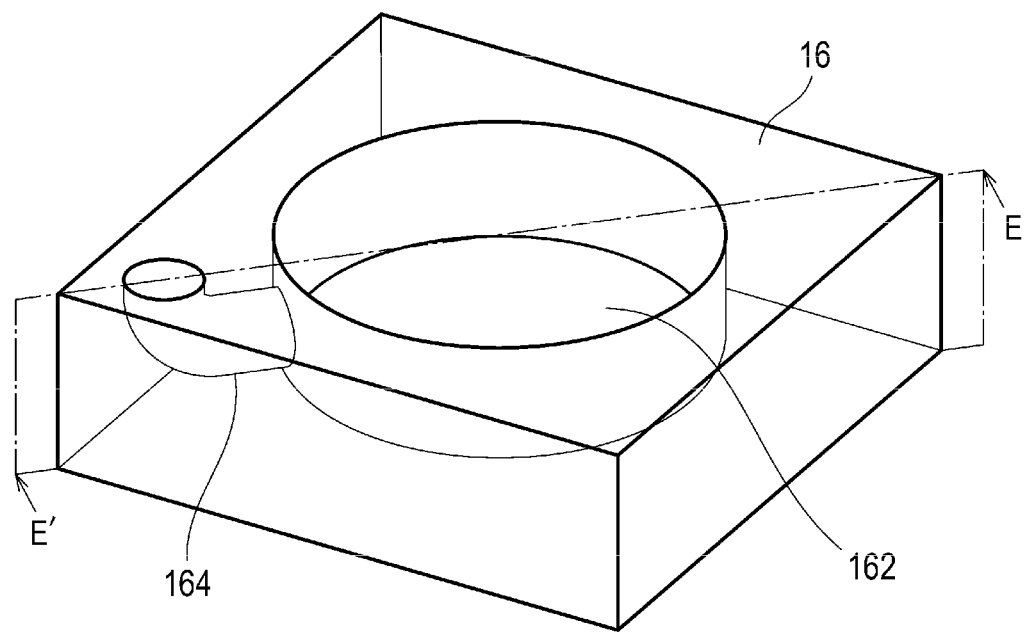
FIG. 22 is a schematic perspective view showing an embodiment of a discharge part that the vaporizer of the invention may have.
Figure 23:
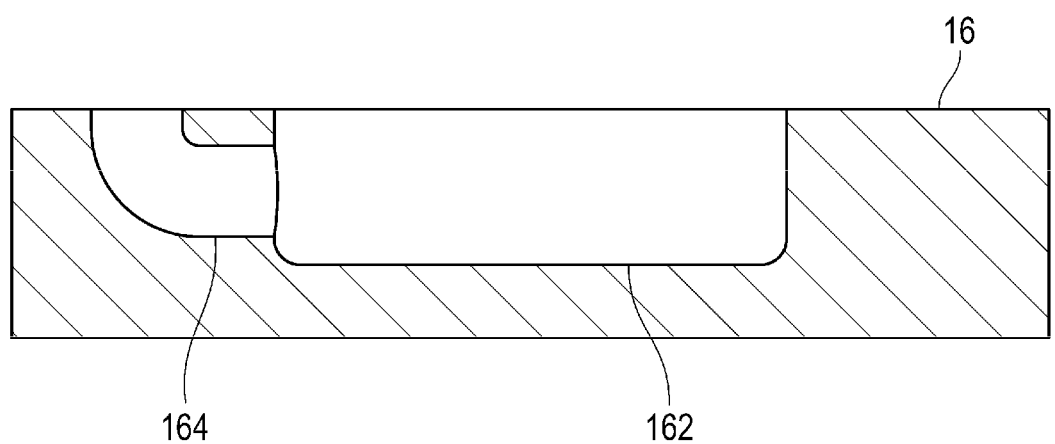
FIG. 23 is a cross-sectional view taken along line E-E' in the embodiment shown in FIG. 22.

FIG. 22 is a schematic perspective view of the discharge part 16. FIG. 23 is a cross-sectional view taken along line E-E' in FIG. 22.

The discharge part 16 illustrated in FIG. 22 collects the gaseous material discharged from the main part 12 as described above and discharges the collected gaseous material outside the system.

In a case of the embodiment illustrated in FIG. 22 and FIG. 23, the gaseous material discharged from the main part 12 is collected in a recess 162. Then, the gaseous material passes through a pathway 164 to be discharged outside the system.

The discharge part 16 is preferably made of a metallic material as in the main part 12.

The vaporizer of the invention preferably has the discharge part.

The vaporizer of the invention is preferably configured to include voids between outer surfaces of the main part and at least a part of the first flow paths and the second flow paths, whereby internal heat is less likely to be released outside. Internal heat is less likely to be released outside by evacuating the interiors of the voids to a vacuum.

The vaporizer of the invention may be further configured to include voids between outer surfaces of the parts other than the main part and at least a part of the first flow paths and the second flow paths, whereby internal heat is less likely to be released outside.

This preferred embodiment is described using FIG. 24 to FIG. 27.

Figure 24:
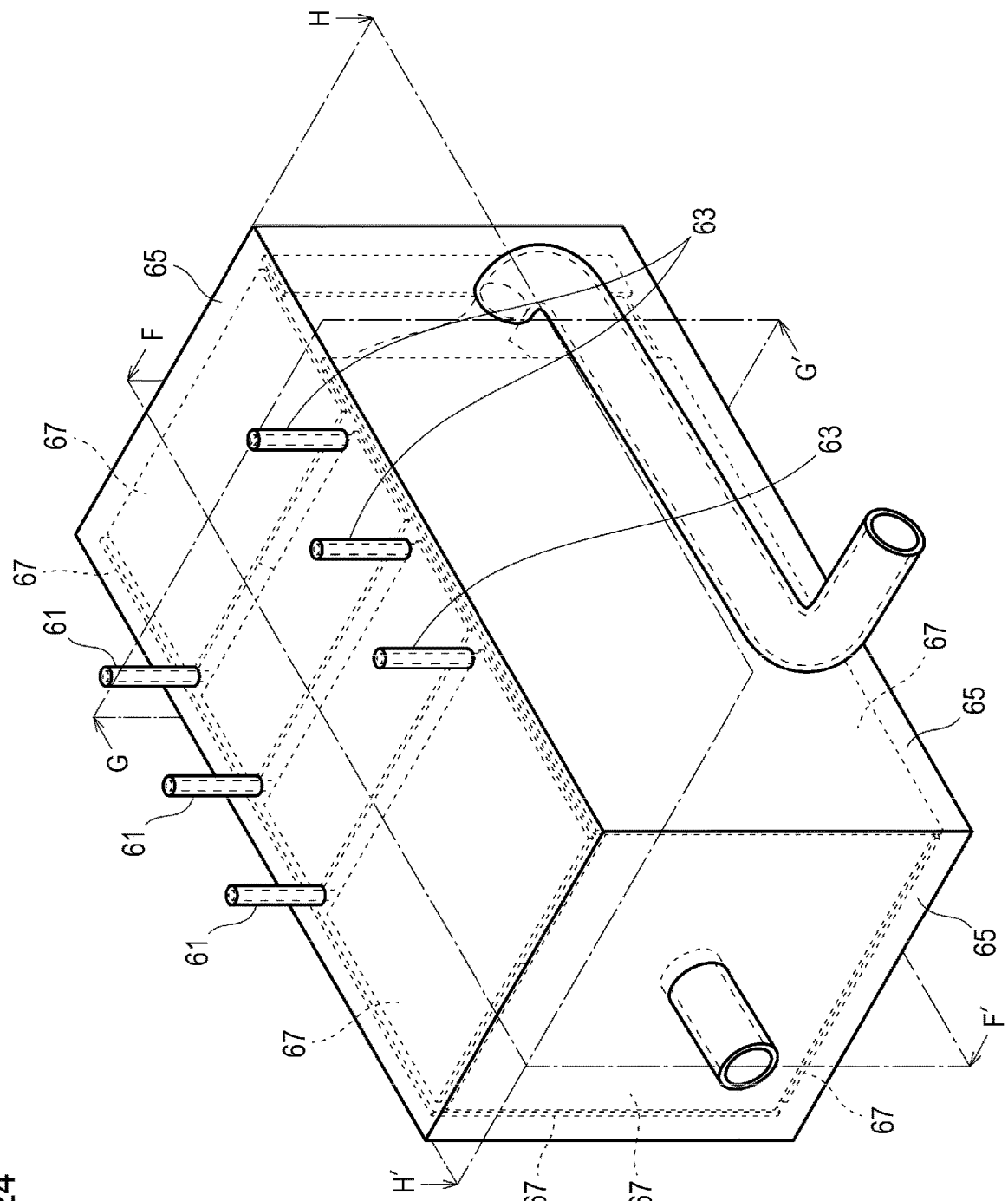
FIG. 24 is a schematic perspective view showing a preferred embodiment of the vaporizer of the invention.

FIG. 24 shows an embodiment in which the main part 12 in the embodiment shown in FIG. 1 is replaced by the main parts (12a, 9a, 12b, 9b, 12c) shown in FIG. 6, introduction holes 61 for introducing the heat medium into second flow paths 72 and discharge holes 63 for discharging the heat medium from the second flow paths 72 are included, and further voids 67 are formed between outer surfaces 65 and at least a part of first flow paths 71 and the second flow paths 72.

Figure 25:
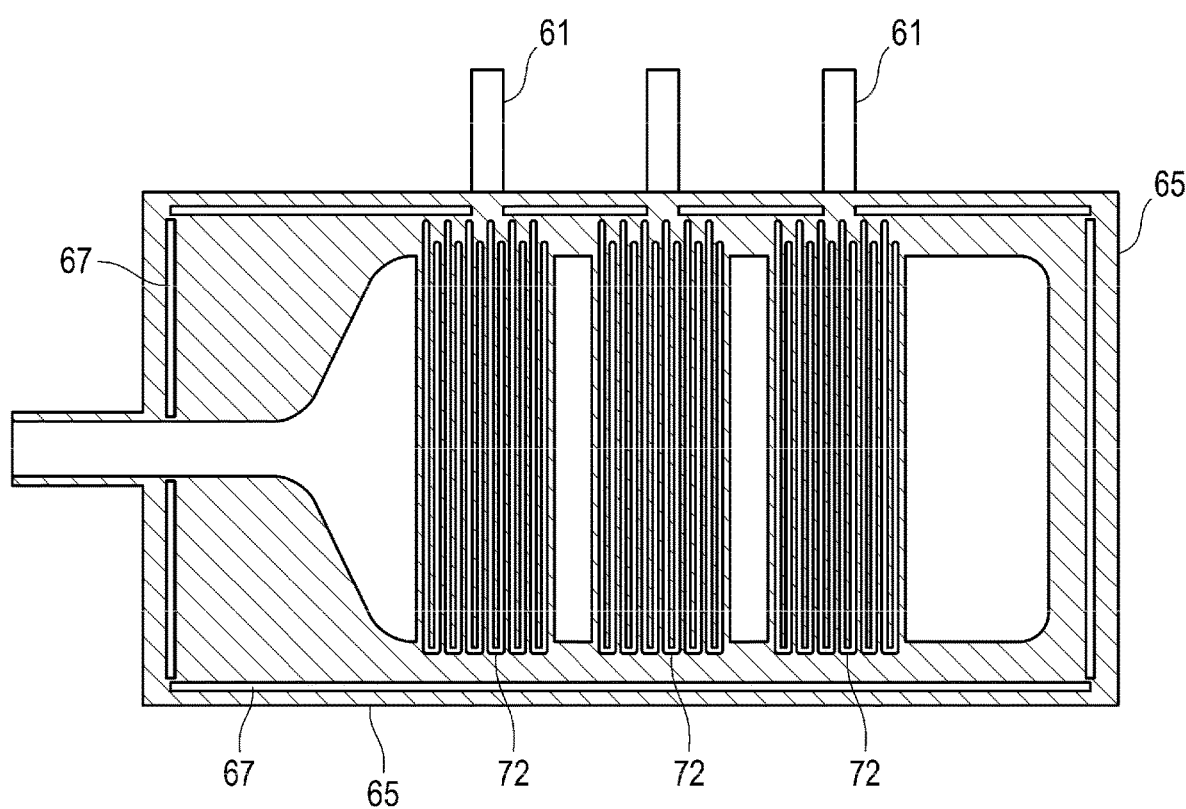
FIG. 25 is a cross-sectional view taken along line F-F' in the embodiment shown in FIG. 24.
Figure 26:
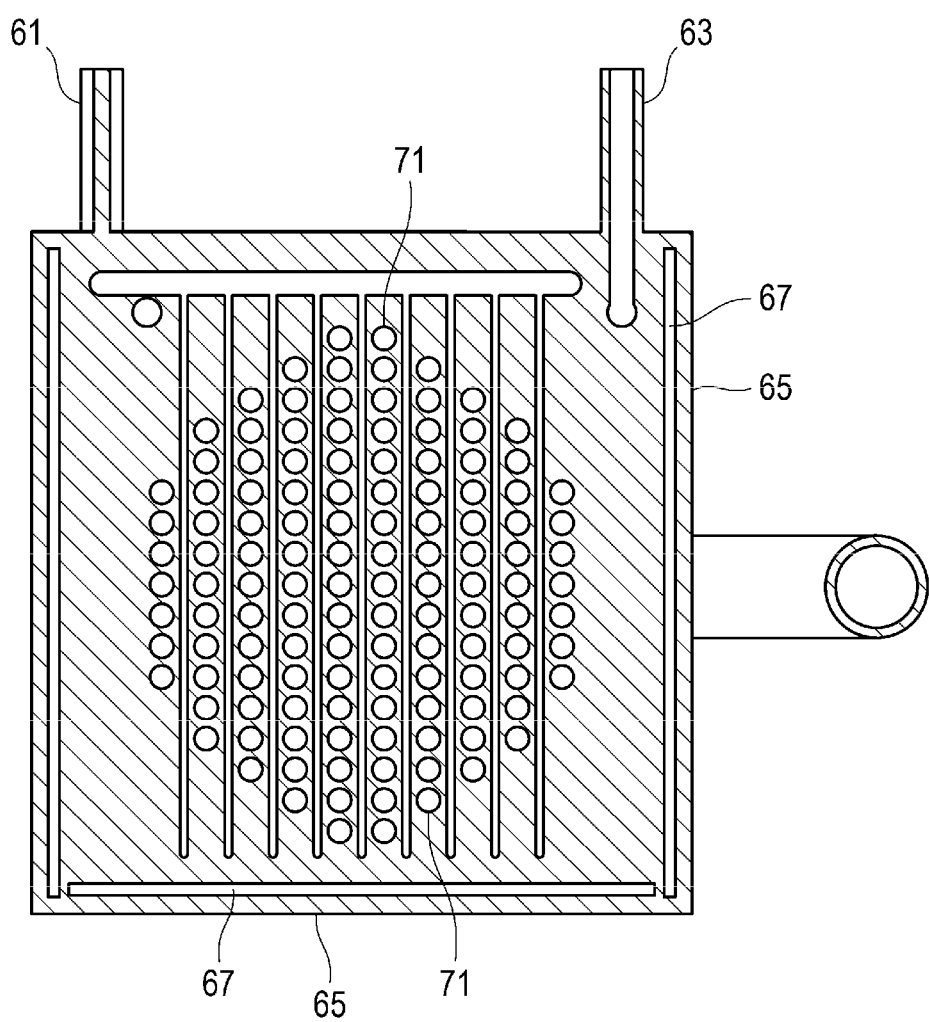
FIG. 26 is a cross-sectional view taken along line G-G' in the embodiment shown in FIG. 24.
Figure 27:
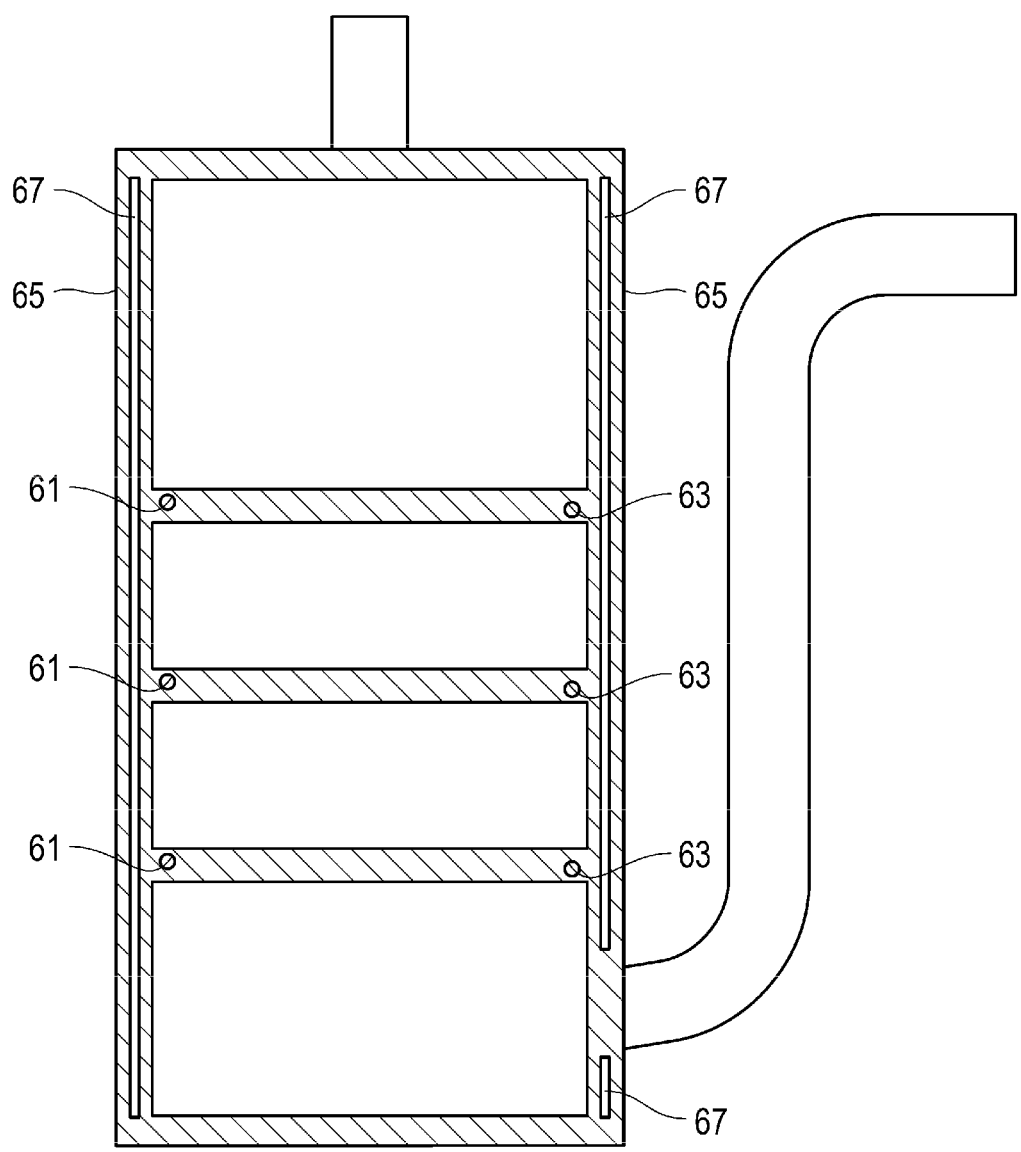
FIG. 27 is a cross-sectional view taken along line H-H' in the embodiment shown in FIG. 24.

FIG. 25 is a cross-sectional view taken along line F-F' in FIG. 24. FIG. 26 is a cross-sectional view taken along line G-G' in FIG. 24. FIG. 27 is a cross-sectional view taken along line H-H' in FIG. 24.

In the preferred embodiment of the vaporizer of the invention shown in FIG. 24 to FIG. 27, the voids 67 are formed between the outer surfaces 65 and at least a part of the first flow paths 71 and the second flow paths 72.

In the case of the preferred embodiment shown in FIG. 24 to FIG. 27, the voids 67 are in principle formed to have a given thickness along the outer surfaces. However, portions where the holes 61 for introducing the heat medium and the holes 63 for discharging the heat medium, as well as holes for introducing the mist of material and discharge holes for discharging the gaseous material are formed, no void 67 may be formed as shown in FIG. 24 to FIG. 27.

The thickness of the voids is not particularly limited and is preferably about 0.5 to 2.0 mm.

The voids can be formed by, for example, the same method as in the first flow paths. The method of forming the first flow paths will be described later.

The vaporizer of the invention which has the voids as described above is preferred because internal heat is less likely to be released outside.

The interiors of the voids as described above may be evacuated to a vacuum. The interiors of the voids can be easily evacuated to a vacuum by manufacturing the vaporizer of the invention using the manufacturing method of the invention to be descried below. The interiors of the voids may be filled with a lagging material, but the case where the interiors of the voids are evacuated to a vacuum is more excellent in thermal insulation properties.

Manufacturing Method of the Invention

The manufacturing method of the invention is now described.

The vaporizer of the invention as described above is preferably manufactured by the manufacturing method of the invention to be described below.

This is described using FIG. 28A to FIG. 30C.

Figure 28A:
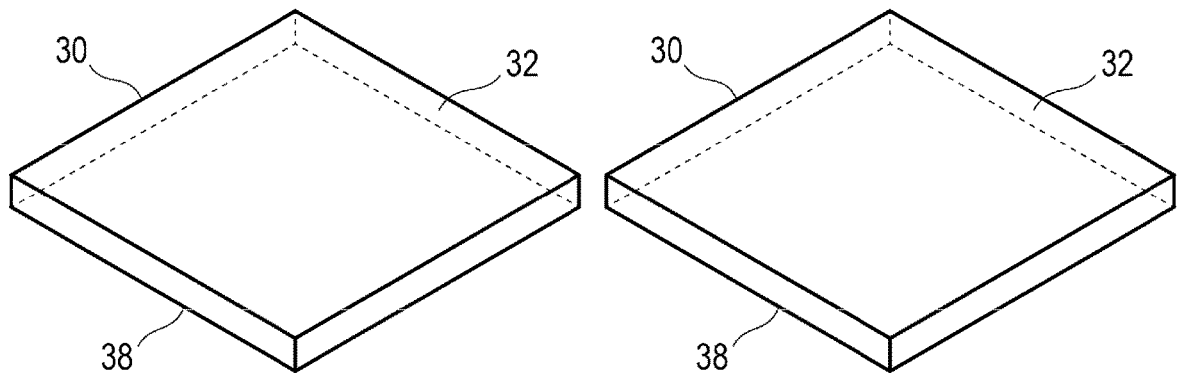
FIGS. 28A-28C are schematic perspective views for illustrating a manufacturing method of the invention.

In the manufacturing method of the invention, as shown in FIG. 28A, a plurality of metallic plates 30 are first prepared.

Figure 28B:
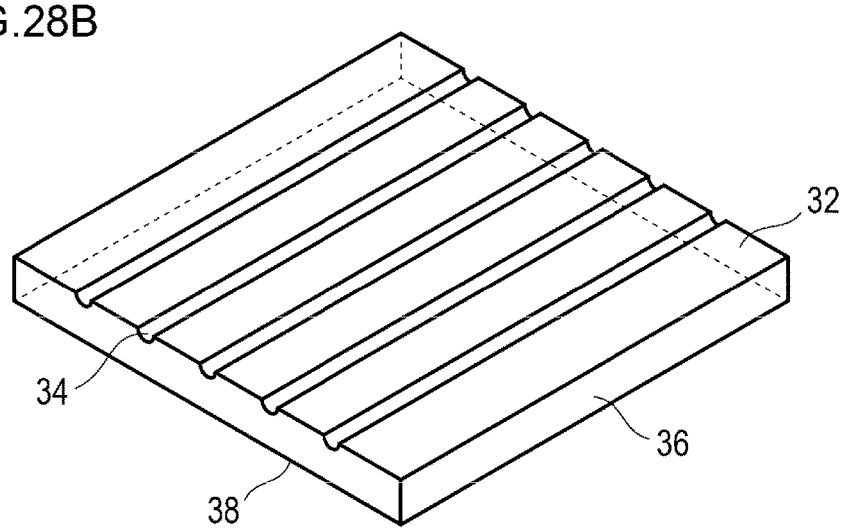

Then, as shown in FIG. 28B, grooves 34 which become part of the second flow paths are formed at a main surface 32 of each plate.

The method of forming such grooves 34 is not particularly limited. The grooves may be formed by chemical methods such as etching, or be formed by physical methods such as laser machining and cutting.

Figure 28C:
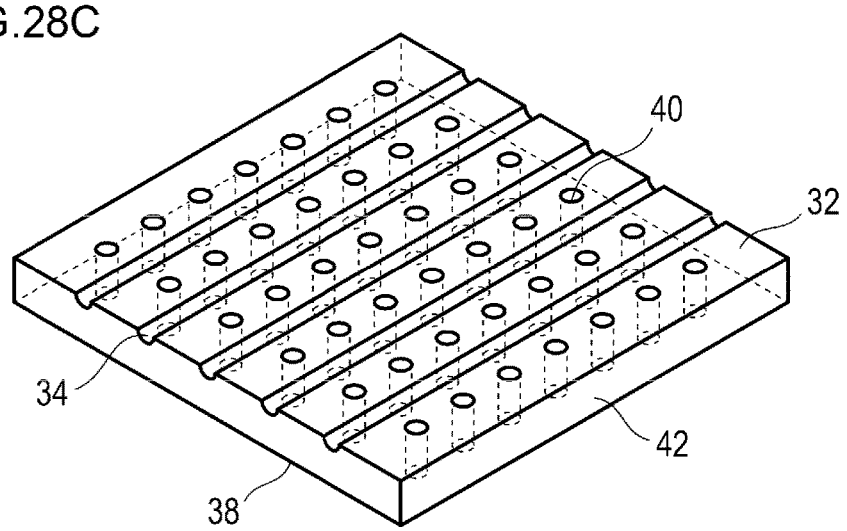

Next, as shown in FIG. 28C, each of through-holes 40 which extends from the main surface 32 to an opposite main surface 38 is formed. For instance, the through-holes 40 can be formed using drills. The through-holes 40 may be formed by chemical methods such as etching, or physical methods such as laser machining and cutting.

The through-holes 40 become part of the first flow paths.

Figure 29A:
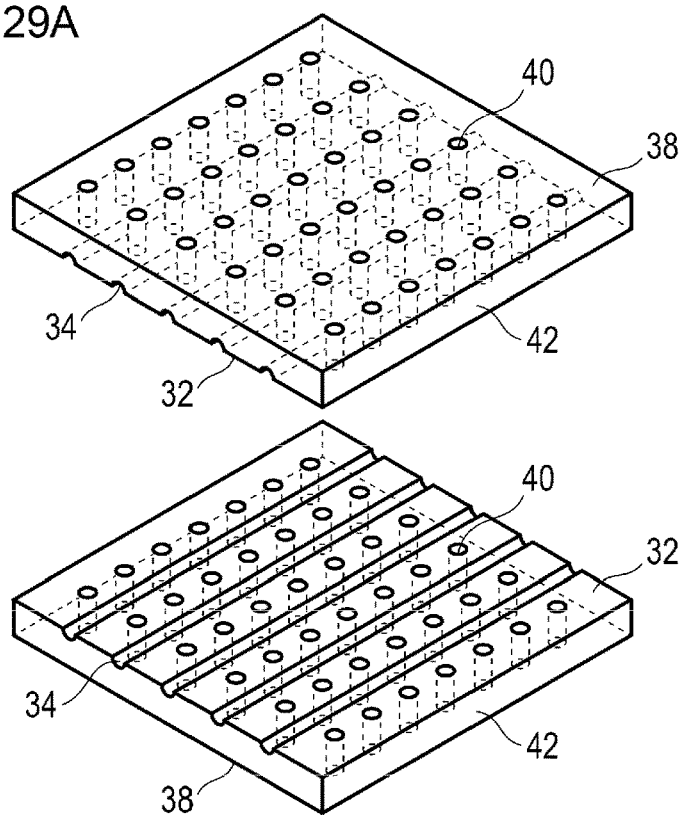
FIGS. 29A-29C are schematic perspective views for illustrating a subsequent part in the manufacturing method of the invention.
Figure 29B:
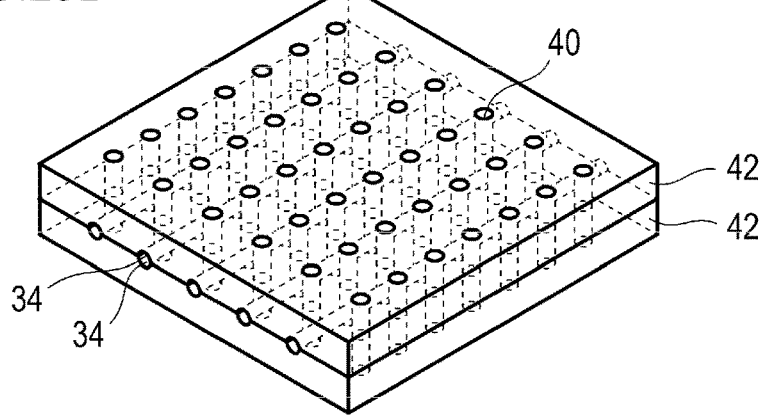

Next, the main surfaces 32 of metallic plates 42 having the grooves 34 and the through-holes 40 formed therein are brought into close contact with each other (FIG. 29A, FIG. 29B).

Figure 29C:
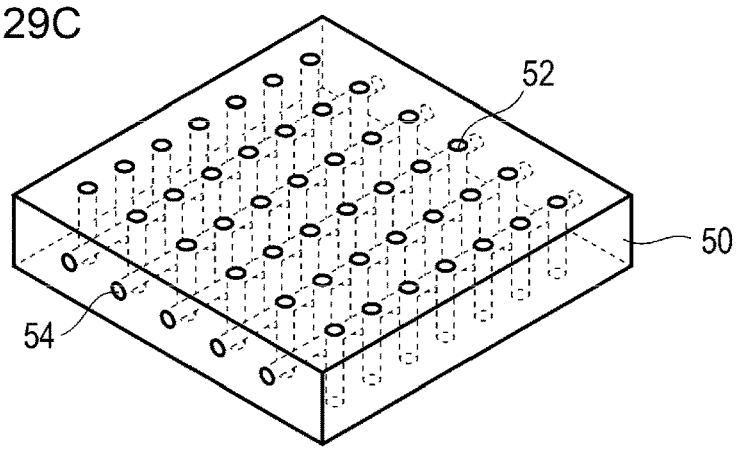

Then, the main surfaces 32 of the metallic plates 42 are joined together by diffusion bonding, whereby a portion 50 for the main part as shown in FIG. 29C which includes first flow paths 52 and second flow paths 54 in its interior can be obtained.

Then, a plurality of portions 50 for the main part as shown in FIG. 29C are formed, and their main surfaces are joined together by diffusion bonding, whereby the main part can be obtained.

Figure 30A:
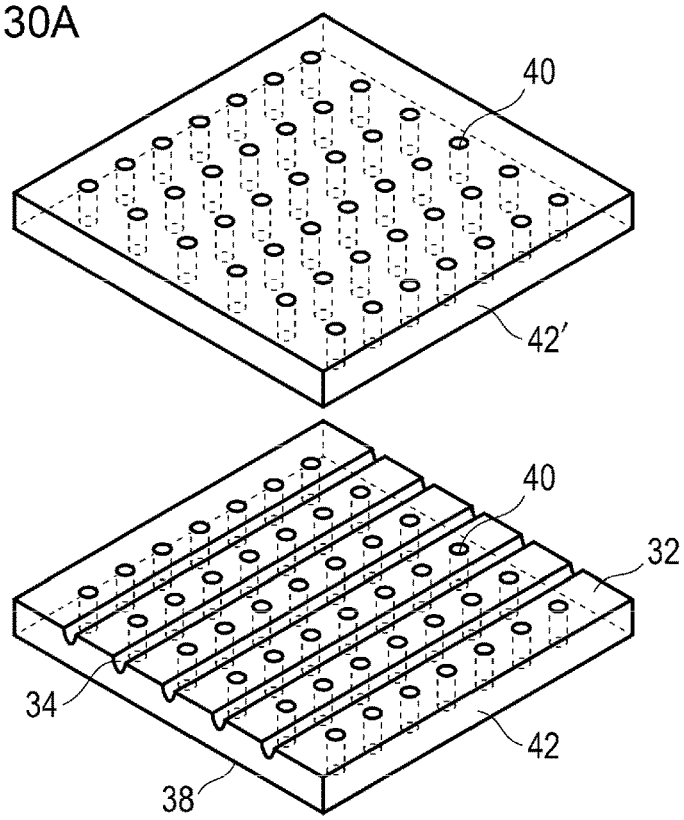
FIGS. 30A-30C are schematic perspective views for illustrating another manufacturing method of the invention.
Figure 30B:
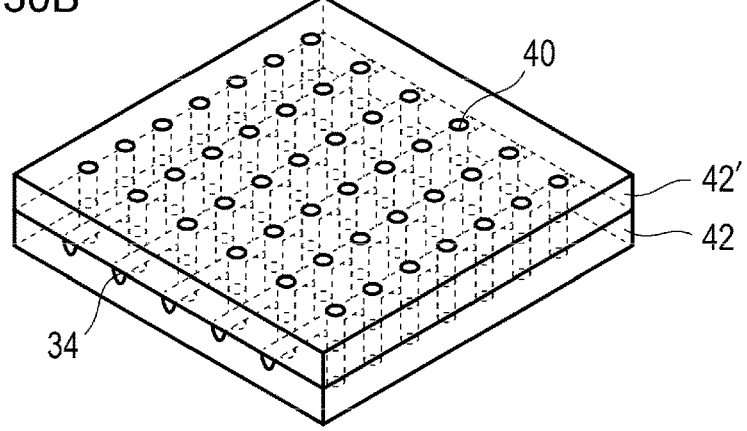

FIGS. 29A-C refer to the case where the two metallic plates 42 each having the grooves 34 which are formed at the main surface 32 and become part of the second flow paths are brought into close contact with each other and joined together. However, as shown in FIG. 30A, a metallic plate 42 having grooves 34 and through-holes 40 formed therein and another metallic plate 42' in which through-holes 40 are formed but no grooves 34 are formed may be brought into close contact with each other and joined together.

Figure 30C:
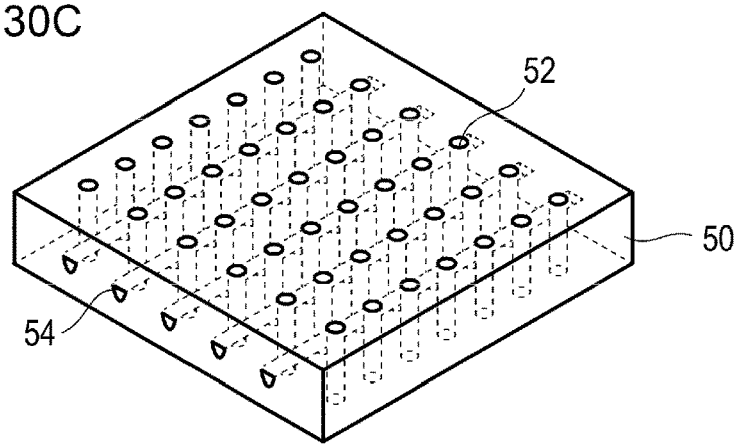

Then, main surfaces 32 of the metallic plates 42, 42' are joined together by diffusion bonding, whereby a portion 50 for the main part as shown in FIG. 30C which includes first flow paths 52 and second flow paths 54 in its interior can be obtained.

Then, a plurality of portions 50 for the main part as shown in FIG. 30C are formed, and their main surfaces are joined together by diffusion bonding, whereby the main part can be obtained.

The invention claimed is:

1. A vaporizer for obtaining a gaseous material for film formation by vaporizing a mist of material through heating, the vaporizer comprising inside a main part made of a metallic material: first flow paths through which the mist of material flows and second flow paths through which a heat medium for heating the mist of material flows;
   the first flow paths having a cross-sectional diameter in terms of equal area circle equivalent diameter of 5 mm or less, and the second flow paths having a cross-sectional diameter in terms of equal area circle equivalent diameter of 2 mm or less; and
   voids other than the second flow paths do not exist inside the main part between one first flow path and other first flow paths present next thereto.

2. The vaporizer for obtaining a gaseous material for film formation according to claim 1,
   wherein, in a cross-section of the main part in a vertical direction with respect to a direction in which the mist of material flows,
   when a direction in which the heat medium flows in a serpentine manner is taken as a horizontal direction, holes of the first flow paths are arranged in line in the horizontal direction, and hole rows are arranged to form layers in a vertical direction,
   the second flow paths are present between vertically adjacent hole row layers, respectively, the second flow paths are not connected to the first flow paths, and the second flow paths vertically meander so as to avoid the holes of the first flow paths in the hole row layers between which the second flow paths are sandwiched in the vertical direction, respectively.

3. The vaporizer for obtaining a gaseous material for film formation according to claim 1, wherein the vaporizer is configured so that, when each of the first flow paths is separated into a plurality of sections in its longitudinal direction, a temperature of the mist of material present inside each of the first flow paths is adjustable for each of the sections.

4. The vaporizer for obtaining a gaseous material for film formation according to claim 1, wherein, in a case where a surface in the main part at which holes for flowing the mist of material thereinto are formed is referred to as an inlet side surface, and a surface in the main part at which holes for discharging the gaseous material are formed is referred to as an outlet side surface, the equal area circle equivalent diameter of the first flow paths present in its interior gradually varies from the inlet side surface toward the outlet side surface.

5. The vaporizer for obtaining a gaseous material for film formation according to claim 1, wherein, in a case where the first flow paths are arranged to be in a vertical direction, the second flow paths are formed in a horizontal direction, and they are orthogonal to each other.

6. The vaporizer for obtaining a gaseous material for film formation according to claim 1, wherein the vaporizer is configured to include voids between outer surfaces of the main part and at least a part of the first flow paths and the second flow paths, whereby internal heat is less likely to be released outside.

7. A vaporizer-manufacturing method for obtaining the vaporizer according to claim 1, the vaporizer-manufacturing method comprising:
   a step which includes preparing a plurality of metallic plates, forming grooves becoming part of the second flow paths at one main surface of each of the plurality of metallic plates, and further forming through-holes becoming part of the first flow paths and extending from the main surface to an opposite main surface; and
   a step which includes bringing main surfaces of the metallic plates into close contact with each other and joining the metallic plates together by diffusion bonding.

* * * * *